(12) United States Patent
Chen

(10) Patent No.: US 8,653,598 B2
(45) Date of Patent: Feb. 18, 2014

(54) ELECTRICAL SWITCH USING GATED RESISTOR STRUCTURES AND THREE-DIMENSIONAL INTEGRATED CIRCUITS USING THE SAME

(76) Inventor: Shu-Lu Chen, Taipei (TW)

( * ) Notice: Subject to any disclaimer, the term of this patent is extended or adjusted under 35 U.S.C. 154(b) by 0 days.

(21) Appl. No.: 13/226,218

(22) Filed: Sep. 6, 2011

(65) Prior Publication Data

US 2012/0056258 A1 Mar. 8, 2012

Related U.S. Application Data

(60) Provisional application No. 61/380,283, filed on Sep. 6, 2010.

(51) Int. Cl.
| | |
|---|---|
| H01L 27/12 | (2006.01) |
| H01L 29/76 | (2006.01) |
| H01L 23/62 | (2006.01) |
| H01L 27/11 | (2006.01) |
| H01L 21/70 | (2006.01) |
| H01L 29/00 | (2006.01) |

(52) U.S. Cl.
USPC ........... 257/350; 288/351; 288/358; 288/359; 288/360; 288/363; 379/380; 379/536; 379/581

(58) Field of Classification Search
USPC ............ 257/4, 288, 379–380, 402–404, 407, 257/528, 536–538, E21.422, E29.255
See application file for complete search history.

(56) References Cited

U.S. PATENT DOCUMENTS

| | | | | |
|---|---|---|---|---|
| 4,665,423 | A * | 5/1987 | Akiya | 257/392 |
| 5,266,511 | A * | 11/1993 | Takao | 438/401 |
| 5,953,614 | A * | 9/1999 | Liu et al. | 438/303 |
| 6,147,378 | A * | 11/2000 | Liu et al. | 257/316 |
| 2002/0160572 | A1 * | 10/2002 | Lee | 438/270 |
| 2005/0090066 | A1 * | 4/2005 | Zhu et al. | 438/300 |
| 2005/0263829 | A1 * | 12/2005 | Song et al. | 257/379 |
| 2007/0145474 | A1 * | 6/2007 | Annese et al. | 257/329 |
| 2008/0237717 | A1 * | 10/2008 | Chen et al. | 257/348 |

* cited by examiner

*Primary Examiner* — Steven Loke
*Assistant Examiner* — Juanita B Rhodes
(74) *Attorney, Agent, or Firm* — Chun-Ming Shih; HDLS IPR Services

(57) ABSTRACT

An electrical switch using a gated resistor structure includes an isolation layer, a doped silicon layer arranged on the isolation layer and having a recessed portion with reduced thickness, the doped silicon layer having a predetermined doping type and a predetermined doping profile; a gate layer arranged corresponding to the recessed portion. The recessed portion in the doped silicon layer has such thickness that a channel defined under the gate can be fully depleted to form a high resistivity region. The recessed channel gated resistor structure can be advantageously used to achieve high interconnect density with low thermal budget for 3D integration.

20 Claims, 22 Drawing Sheets

ELECTRICAL SWITCH USING GATED RESISTOR STRUCTURES AND THREE-DIMENSIONAL INTEGRATED CIRCUITS USING THE SAME

CROSS-REFERENCE TO RELATED APPLICATIONS

This application claims priority benefit of U.S. Provisional Patent Application No. 61/380,283, filed on Sep. 6, 2010 and entitled "Process and structure for three-dimensional integrated circuit by transferred substrate and gated resistor," which is hereby incorporated herein by reference.

STATEMENT REGARDING FEDERALLY SPONSORED RESEARCH OR DEVELOPMENT

Government Rights:
This invention was made with Government support under contract N66001-04-1-8916 awarded by the Defense Advanced Research Projects Agency.
The Government has certain rights in this invention.

BACKGROUND OF THE INVENTION

1. Field of the Invention

The present invention relates to low thermal budget gated resistor structures, and more particularly, its application for device level three-dimensional (3D) integration with higher interconnect density compared to the current wafer bonding/packaging and "through silicon via" (TSV) technology.

2. Description of the Related Art

In response to the increasing challenges in maintaining technology advancements through traditional "constant electrical field" scaling at a pace consistent with Moore's law, alternative methods to achieve enhanced system level performance are becoming increasingly important. Three-dimensional (3D) integration technology, which means having at least two active device layers connected vertically, has the potential to provide significant performance enhancements by reducing long lateral signal connection path into short vertical one while at the same time increasing the device density.

Overall, 3D integration technology can be broadly defined as any technology that stacks semiconductor elements, such as electrical transistors or optical devices, on top of each other and uses both vertical and lateral interconnects to transfer signals through different layers of semiconductor elements. Currently, there are two major approaches to achieve wafer level 3D integration: wafer bonding and monolithic stacking.

Wafer bonding allows individual layers to be fabricated separately with the existing fabrication technology and then these layers are bonded to each other after devices have already been formed. It requires relative small modification of device fabrication technology but requires additional process development to reliably thin the wafer, attach wafers with high alignment accuracy, and to form high quality interconnects with high aspect ratio. Usually, the pads and interconnects in this approach have to be large enough to account for misalignment during the wafer bonding process. The most commonly used method to form such vertical connections is by using through-silicon via (TSV) either before or after the devices have been fabricated. The dimension of TSV is limited by the ability of high aspect ratio etching and the alignment accuracy during bonding. Typically the smallest dimension of TSV is around 0.5 um to 1 um. Such dimension is small enough for most applications but still too big if compared to the capability of device level interconnects/via, which can be smaller than 0.1 um.

By contrast, monolithic stacking refers to processing each layer directly on top of lower layers and it generally provides higher interconnect density because each layer is aligned precisely to the lower existing layer using advanced lithography tool and interconnect dimension as small as 0.1 um can be achieved. However, monolithic stacking involves significant processing modifications for the layer that fabricated on top of the existing layer. In general, the process temperature for the upper layer must be kept lower than those used for the lower layer to avoid further dopant diffusion and junction deformation. If there are metal layers in the structure, temperatures must be kept below 450° C. to avoid metal deformations. Such thermal constrains poses significant limitation on the feasibility of monolithic stacking.

Basically, the core difference between these two methods simply represents the trade-off between performance (high interconnect density) and fabrication complexity (thermal constraints). FIG. 1 shows the general process flow of wafer bonding and monolithic stacking. Currently, wafer bonding using TSV as the vertical interconnect requires less thermal budget and can be adapted easily by current technology. As a result, most of the focus of industry is now on TSV/wafer bonding technology combined with advanced packaging techniques. For monolithic stacking, despite its potential ability of providing high interconnect density, the difficulty in fabrication, particularly thermal budget, limits its adoption.

To further explain such difficulty of thermal constrains, a brief illustration of current CMOS process is provided. FIG. 2 schematically depicts a sectional view of CMOS transistor, where the bottom dashed box indicates the front-end-of-line (FEOL) process, and the top dashed box indicates back-end-of-line (BEOL) process. More particularly, the FEOL denotes the first portion of IC fabrication where the individual devices are patterned in the semiconductor. In the shown example of FIG. 2, FEOL contains all processes of CMOS fabrication needed to form fully isolated CMOS elements such as gate module, source and drain module. The BEOL denotes the second portion of IC fabrication where the individual devices get interconnected with wiring on the wafer. In the shown example of FIG. 2, BEOL contains the metal plug and interconnect atop the gate, source and drain of the CMOS transistors.

In modern VLSI technology, most process steps such as lithography, deposition and etching, are relatively low temperature or can be done at low temperature. There are, however, two high temperature critical steps limit the feasibility of monolithic stacking integration: getting a high quality single crystal substrate on top of existing layer/devices, and subsequent dopant activation. The activation of source/drain (S/D) in current Si technology often requires temperature much higher than 450° C., and low temperature source/drain annealing results in significant performance loss and high contact resistance. Laser annealing has been pursued because the energy can be limited locally, but such process generally has lower throughput. Aside from dopant activation, getting a single crystal substrate to start with is also problematic because it is hard to form single crystal layer on top of the amorphous isolation layer, which encapsulates the devices in the lower layer. Even with long time and high temperature anneal, the starting layer could still be poly-grained instead of single crystal. These two constrains can be seen also in FIG. 1, which shows that to achieve high performance by monolithic stacking, these two thermal bottlenecks: getting a single crystal substrate in which to build high performance devices in the upper layers and the subsequent dopant activation for forming p-n junctions have to be resolved.

Up to now, one has to wonder if there is a desirable process methodology for building multiple layer devices with both acceptable thermal budget and high interconnect density. As a result, a "bonding substrate/monolithic contact" (BSMC) approach is proposed to combine both advantages from wafer bonding and monolithic stacking.

Considering these two high temperature bottlenecks from a 3D integration point of view, first, getting single crystal film as an upper layer does not require any precise alignment to a lower layer because at this stage most fine pitch device modules, such as gate module or source/drain module, are not fabricated yet. Hence it is possible to take advantage of the wafer bonding technique by attaching a single crystal layer to the acceptor wafer instead of monolithically growing a single crystal upper layer. Bonding a single crystal layer prepared with standard higher temperature process can avoid significant thermal impact to the lower layers with almost no alignment penalty and performance loss because at this stage the bonded single crystal are still close to blank film without any fine pitch module done. This wafer bonding is different from the previous mentioned one while the previous one refers to bonding two already processed wafers containing multiple transistors and semiconductor elements. However, source/drain regions activation is more problematic since traditionally they are done after fine pitch gate patterning. As a result, if the fine pitch gate module and S/D anneal are done before bonding, then the whole approach actually becomes the previous mentioned wafer bonding technique which still suffers from the possibility of misalignment during bonding. So the S/D formation still needs to be done after bonding a single crystal layer in order to maintain the advantages of high interconnect density.

Based on the process characteristics described above, the "bonding substrate/monolithic contact" (BSMC) approach can be further illustrated in FIG. 3. The concept is to form single crystal film or layer on a donor wafer using standard high temperature processes and then bond the layer to another acceptor wafer. The subsequent device fabrication, including gate, S/D and via/contact formations can then be processed with accurate alignment to the lower layers on the acceptor wafer. Moreover, in order to solve the S/D annealing issue after bonding, as illustrated in FIG. 3, there are several options including: low temperature S/D activation, Laser S/D activation, Schottky barrier S/D, and several gated resistor structures which are part of this invention and will be described below. Moreover, in this invention, a novel recessed channel gated resistor structure, which requires no high temperature S/D activation after gate patterning, is proposed to replace the conventional lateral "npn or pnp" transistor structure. This invention hence provides a novel way for achieving high performance 3D integration.

SUMMARY OF THE INVENTION

It is an object of the present invention to provide a new methodology and structure for 3D integration with low thermal budget and high interconnect density.

Accordingly, the present invention provides an electrical switch using a recessed channel gated resistor structure. The electrical switch includes an isolation layer having a first face and a second face opposite to the first face; a doped silicon layer arranged on the first face of the isolation layer and having a recessed portion with reduced thickness, the doped silicon layer having a predetermined doping type and a predetermined doping profile; a gate dielectric covering at least part of the recessed region of the doped silicon layer; a gate layer arranged atop the gate dielectric and covering at least part of the gate dielectric; at least one electrical contact connected to the doped silicon layer; at least one electrical contact connected to the gate layer; wherein the recessed portion in the doped silicon layer has such thickness that a channel defined under the gate can be fully depleted to form a high resistivity region. That is, the region beneath the recess can be fully depleted to form a high resistivity region. In other words, the channel thickness from the bottom of the recess region to the top of isolation layer has to be thin enough so that external bias from the gate can still influence the electron/hole potential within the channel region.

Accordingly, the present invention provides a method for three-dimensional integration of semiconductor device and comprising:

(a) providing a donor wafer with a first face and a second face opposite to the first face, the donor wafer having at least one buried doped layer located below the first face.

(b) attaching an acceptor wafer including at least one alignment mark and at least one semiconductor onto the first face the donor wafer;

(c) removing part of the donor wafer at the direction from the second face and polishing the donor wafer along the direction from the second face until at least one of the peak concentration of the buried doped layer of the donor wafer is exposed;

(d) with reference to the acceptor wafer, forming a recess structure on the exposed surface of the donor wafer attached to the acceptor wafer;

(e) forming a gate dielectric to cover at least part of the recess structure;

(f) forming a gate layer to cover at least part of the gate dielectric;

(g) with reference to the acceptor wafer, forming at least one contact to the gate layer.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF THE INVENTION

BSMC Methodology

Figure 1:
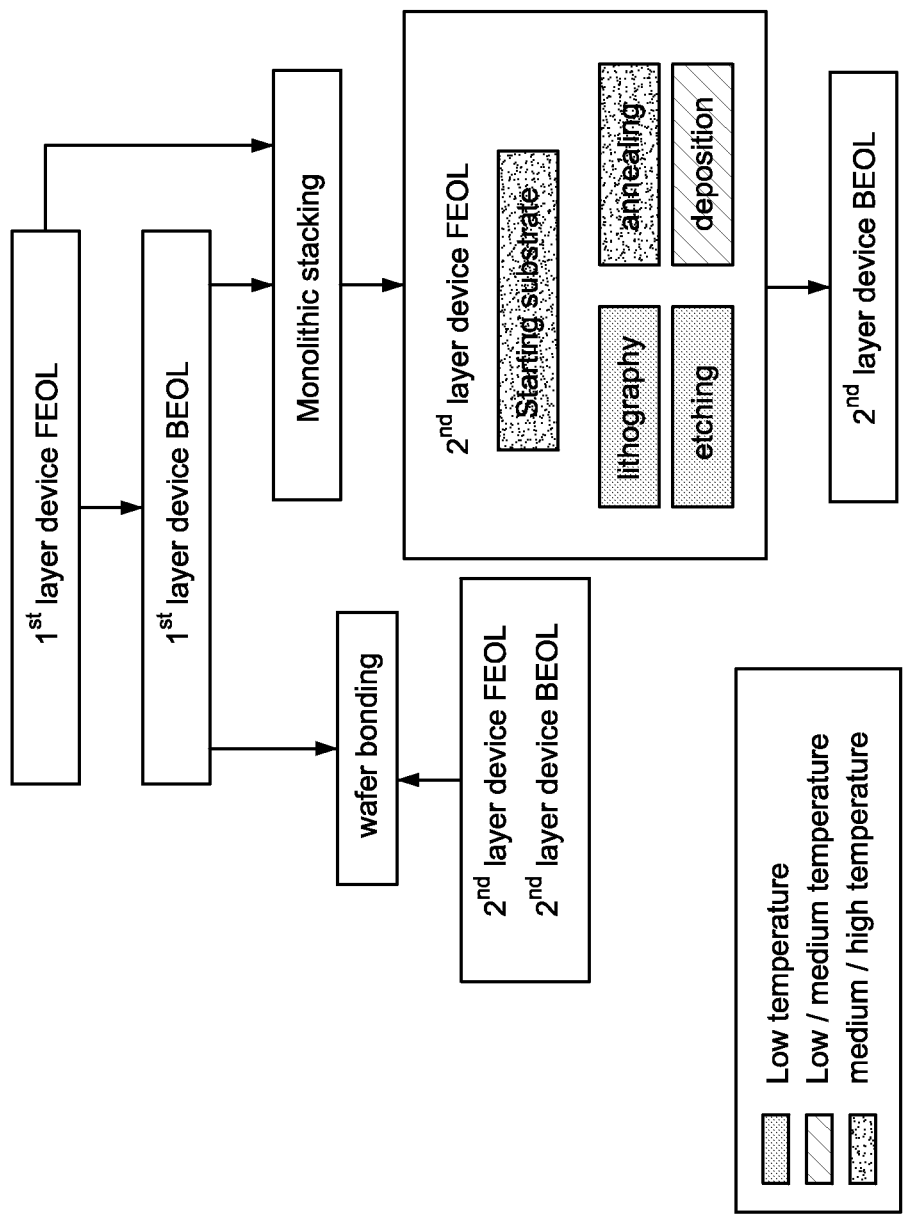
FIG. 1 shows the general process flow of wafer bonding and monolithic stacking.
Figure 2:
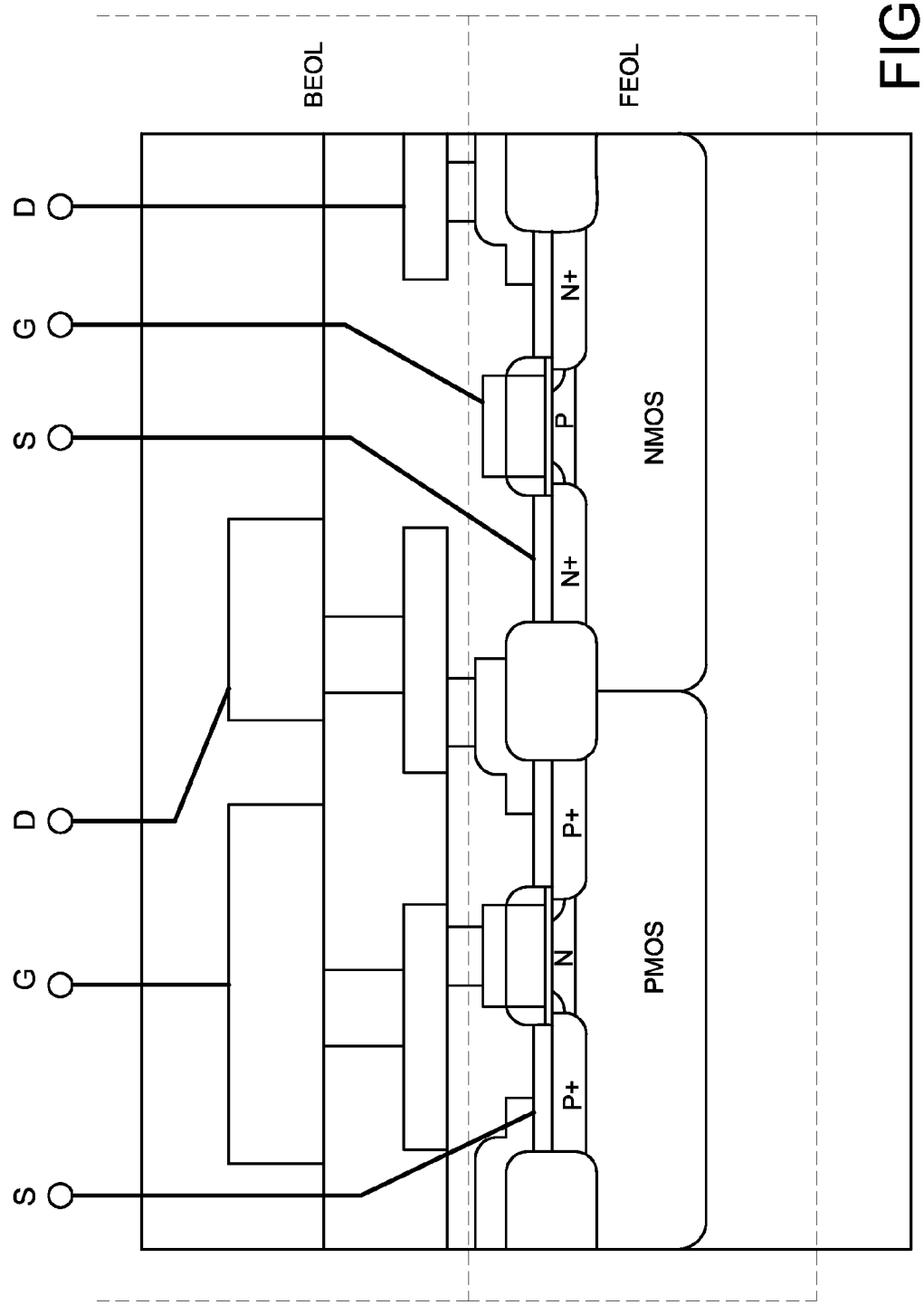
FIG. 2 schematically depicts a sectional view of CMOS transistor and shows the division between the front-end-of-line (FEOL) process and the back-end-of-line (BEOL) process.
Figure 3:
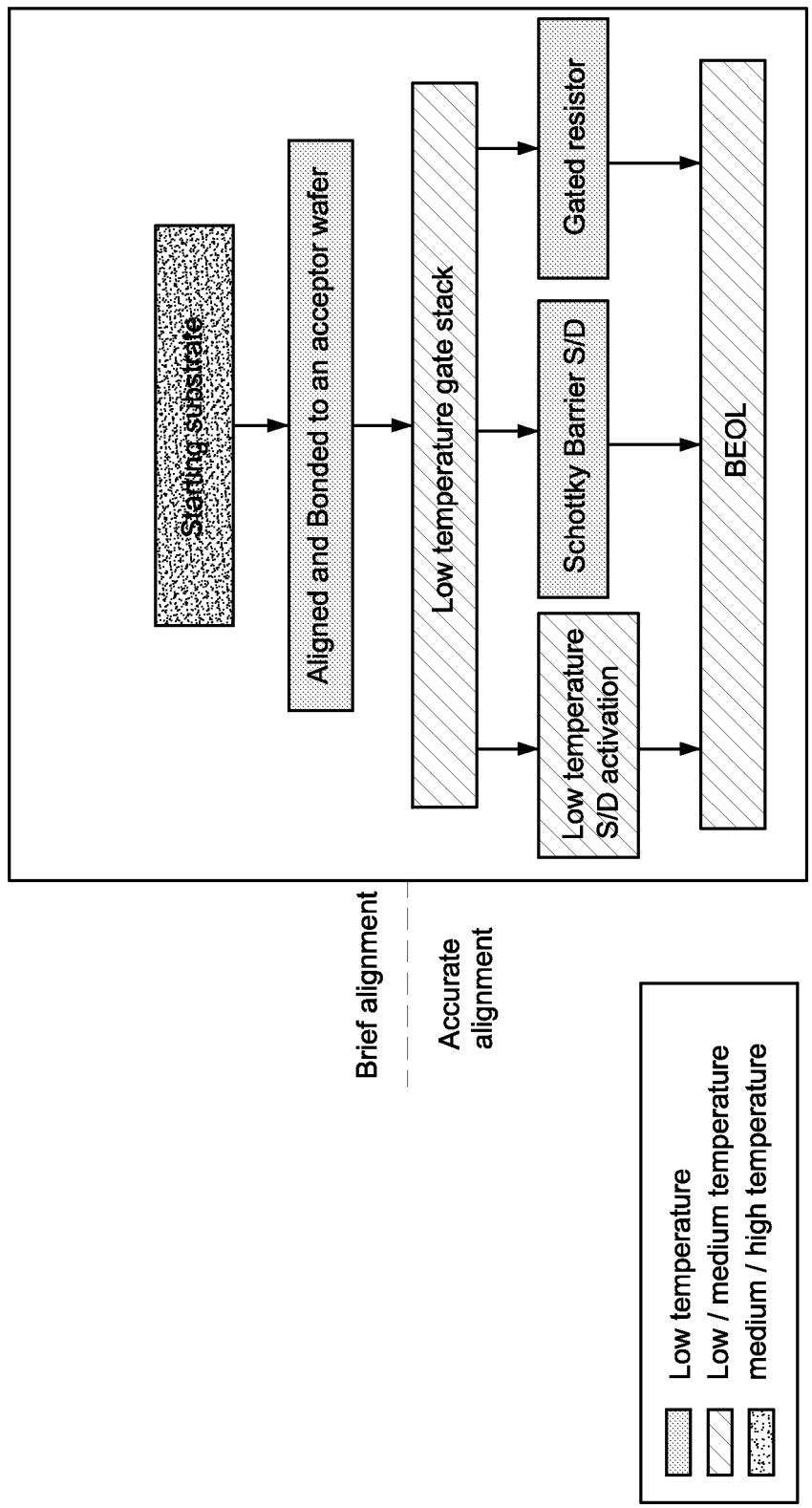
FIG. 3 is a schematic diagram for demonstrates the concept of bonding substrate/monolithic contact (BSMC).

To resolve the issues arising from TSV/wafer bonding and monolithic stacking, a "bonding substrate/monolithic contact" (BSMC) methodology for multiple layer device fabrication is proposed and illustrated in FIG. 3. The general concept is that since substrate annealing and channel activation do not require accurate alignment to the previous layer, they should be done before bonding to avoid unnecessary thermal impact to the acceptor wafer. By doing so we essentially eliminate one of the two thermal bottlenecks mentioned above, leaving only the S/D dopant annealing. For example, we could start with a regular Si substrate, implant and activated, then transferred to an acceptor wafer using oxide to oxide bonding. The bonding process requires little effort on the alignment since at this moment, the layers (implanted and activated) being transferred do not have any fine pitch patterns defined. After the transfer, similar process flow sequence for fabricating a transistor can be used, such as the gate stack formation and source/drain formation. Since typically S/D implant and anneal are done after gate patterning, which has very fine pitch and requires very precise alignment, they can not be moved before bonding. So this second thermal bottleneck, S/D anneal, has to be dealt with by using some alternatives such as Laser anneal, low temperature anneal, Schottky source/drain or non-conventional transistor design concepts such as gated resistor structure proposed in this invention. This approach provides a similar interconnect density to monolithic stacking but with low thermal budget comparable to wafer bonding. According to a preferred embodiment of the present invention, unipolar gated thin film resistor (with or without additional high dose source/drain implant/activation step) is used as the non-conventional transistor design concept to achieve the BSMC methodology. According to another preferred embodiment of the present invention, a recessed channel gated resistor (RCGR) is used to realize the BSMC methodology. Both embodiments are explained in the following contents.

Gated Thin Film Resistor Structure

Before the gated thin film resistor structure is specifically described, the relevant MOSFET technology is reviewed as follows.

Essentially, a MOSFET can be thought as a variable resistor with large resistance tuning range due to the forming of a surface inversion layer at the "on" state and a high energy barrier at the "off" state. Conventionally, the energy barrier in the "off" state is provided by bipolar doping such as "npn" or "pnp" doping profile. However, as the body thickness is reduced approximately to around 15 nm or below, the maximum depletion width from the gate can extend to the bottom of the body with body doping levels approaching the source/drain (S/D) doping level of the conventional MOSFET. At such a thin film limit, the "bipolar" energy barrier can actually be provided by choosing an appropriate gate work function as an "internal" bias to completely deplete the body to create a "pseudo" potential barrier at zero gate bias with just "unipolar" doping profile, such as "nnn" or "ppp" structures. For example, a p+ doped poly silicon gate on a uniformly n+ doped body can be used to deplete the channel region (body) at zero gate bias. As the gate bias increases, the depletion region retreats toward the gate and this allows current to flow across the body instead of being confined to the surface inversion layer in a conventional MOSFET. This type of "unipolar-doped" MOSFET essentially becomes a gated variable "resistor" (channel and source/drain are of the same type of doping, hence "resistor") with its channel resistance modulated by the gate via changing the cross area for current conduction. Hereinafter, the gated thin film resistor structure will be referred to as gated resistor for brevity.

Figure 4A:
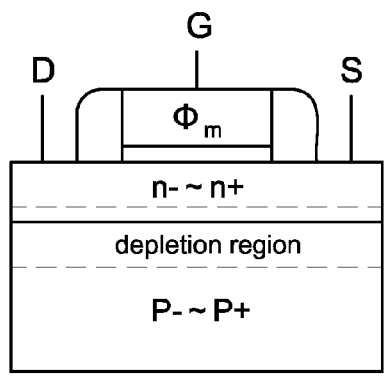
FIGS. 4A to 4D illustrate four examples of SOI or bulk type gated resistor structures.
Figure 4B:
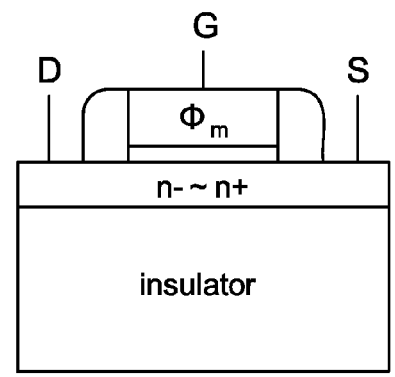
Figure 4C:
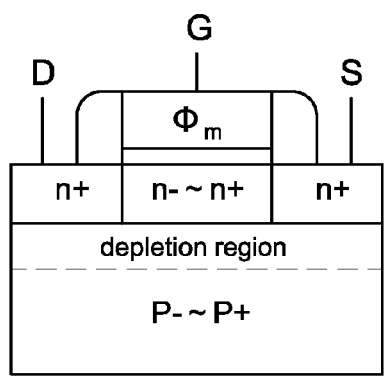
Figure 4D:
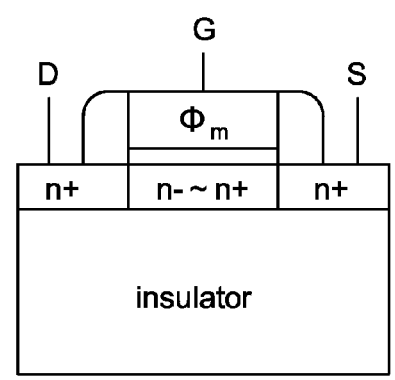

FIGS. 4A to 4D illustrates four examples of gated resistor, where FIG. 4A shows bulk gated resistor, FIG. 4B shows SOI gated resistor, FIG. 4C shows bulk gated resistor but with S/D doped to a higher level, FIG. 4D shows SOI gated resistor but with S/D doped to a higher level. Structures in FIG. 4C and FIG. 4D with higher S/D doping are used to provide a smaller series resistance compared to those without additional S/D doping (channel and S/D have similar doping level). Essentially, those highly doped S/D gated resistor structures (FIGS. 4C and 4D) are very similar to conventional MOSFET except that MOSFET uses surface current conduction while gated resistor uses bulk current conduction.

Being a bulk current conduction mechanism instead of a surface conduction mechanism, the design criteria for the gated resistor are slightly different compared to a conventional MOSFET. The body (channel) thickness has to be smaller or comparable to the maximum depletion width associated with its maximum doping concentration and gate stacks. For example, the maximum depletion width for a standard MOS structure can be expressed by:

$$T_c \sim W_{dm} = \sqrt{\frac{4\varepsilon_s kT \ln(N/n_i)}{q^2 N}}$$

Where $T_c$ is the body thickness, $W_{dm}$ is the maximum depletion width and N is the doping level. Substituting the dimensions into the resistance equation we get the total channel resistance $R_c$ for bulk current conduction:

$$R_c \equiv \frac{1}{q\mu N} \frac{L}{A} = \frac{1}{q\mu N} \frac{L_g}{W \times T_c} = \frac{L_g}{W} \frac{1}{\mu \sqrt{4\varepsilon_s kTN \ln(N/n_i)}}$$

Where u is the carrier mobility, W is the device width body thickness, $L_g$ is the gate length. Generally the channel resistance of the devices shown in FIGS. 4A to 4B decrease with increased channel doping. Although the body thickness (cross sectional area for conduction) has to decrease as the doping level increases to meet the maximum depletion criteria, the combined effect still favors the use of higher doping. After maximizing the body doping, an appropriate gate work function must be chosen to adjust the threshold voltage. In fact, for a gated resistor, the previous three design parameters, channel thickness, channel doping and work function, are highly correlated and the design margin is smaller than the conventional MOSFET.

Since the critical requirement for the gated resistor is the ability to deplete the channel from all sides to block the current flow, SOI or p-n junction depletion region can both be used as shown in FIGS. 4A-4D. Compared with SOI structure, the channel of the bulk type can be depleted not only from the top gate but also from the underlying p-n junction depletion region, and it implies that it is easier for the bulk type to be turned-off at the same body doping level. Besides, the bottom p-n junction doping can also be used to adjust the threshold voltage and provides more flexible design margins compared to the SOI structure.

Performance-wise, simulation based on well-calibrated Si process parameters and device physics are done and the result shows generally comparable short channel effect control, subthreshold slope and leakage current for gated resistor structures and the conventional MOSFET. However, fabrication-wise, without additional source/drain implant and activation after gate patterning, the gated resistor structure has fewer lithography steps and requires a much lower thermal budget. As a result, the gated resistor structure, such as shown in FIGS. 4A and 4B, is further proposed to be used for 3D integration.

Application of Gated Resistor Structure to BSMC Process

To integrate the gated resistor into the BSMC process, before attaching to the acceptor wafer, multiple-layers or materials which have already been implanted and annealed, with its doping condition calculated based on the channel doping requirement explained before, are formed on the donor wafer. After transferring these layers from a donor wafer to an acceptor wafer, alignment and active region etch are performed to open the already implanted and annealed layers for further fabrication. The basic concept is that because etching off a layer requires a lower temperature than growing or annealing a layer, by pre-fabricating all the required layers with standard high temperature process before bonding to the acceptor wafer and then selectively etching these layers off after bonding, significant thermal budget can be saved. Essentially, by using the gated resistor structures, the self-aligned S/D implant and activation process can be eliminated by transforming the conventional "lateral npn or pnp profile" into a "vertical multi-layer" structure, which is a major difference compared to the conventional MOSFET structure/process. Using the vertical arrangement eliminates the need for precise lateral alignment during bonding because the top surface of the donor wafer can still be treated as a blank film but actually contains all the required structure and information for further device fabrication after bonding.

Figure 5:
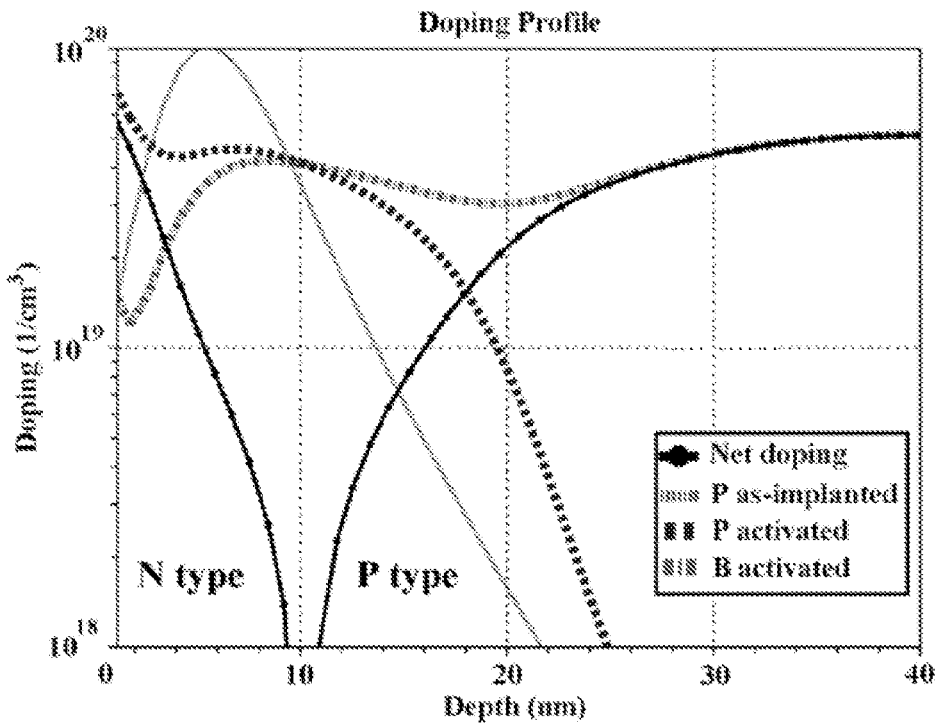
FIG. 5 illustrates one of the possible doping profiles achieving the dual high-doping layers.

For CMOS application, a vertical thin film p-n junction might be required for both p type and n type the gated resistor structures. To achieve such shallow doping profile, well-control epitaxial growth or shallow implants can be used. FIG. 5 shows the simulation doping profile by following one of the possible process examples for achieving such vertical thin film p-n junction. An initial $7\times10^{19}$ (/cm$^3$) Boron doping is thermal oxidized at 850° C. for 15 minutes to segregate Boron into oxide and wet etched off to reduce the surface doping level. Shallow Phosphorus implant at 2 keV with dose $7\times10^{13}$ (/cm$^2$) is used and followed by 850° C., 1 second activation. Similar processes, such as using very shallow multiple implant steps or taking advantages of the fact that Boron tends to segregate into oxide, could also be used to provide the profile while the exact process parameters, such as dose, implant energy, time and temperature can all be adjusted by people skilled in this art.

Figure 6:
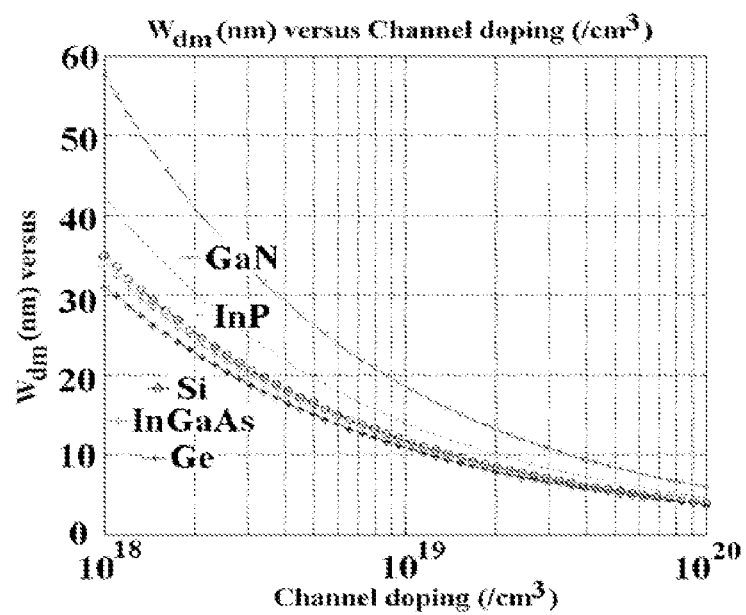
FIG. 6 shows various materials with their corresponding maximum depletion widths.

In practical, one potential issue remains for the gated resistor, both SOI or bulk type described above. That is, in order to suppress the high contact resistance, high doping must be used for S/D, and since channel doping has similar or the same doping level as S/D, this leads to the requirement of handling/processing ultra thin layer for the channel in order to meet the maximum depletion width requirement. There are some materials require only low temperature process or that can form Ohmic contacts at lower doping concentration, and they can be potentially used to relieve the difficulty in handling the thin films. FIG. 6 shows some alternative materials which have thicker maximum depletion width compared to silicon at the same doping level.

However, for Silicon, the most important material used in current semiconductor industry, forming a proper Ohmic contact generally requires doping level higher than $5\sim6\times10^{19}$/cm$^3$. This leads to a maximum depletion width around 5 nm and forming such thin doping layers and transferring them are very challenging for practical manufacturing. While some multi-gate structures can be used to provide better gate control over the thicker channel, the process modification involved might also be challenging. As a result, a practical and economic solution by using a recessed channel concept is proposed in this invention as described below to facilitate ultimate 3D integration.

Recessed Channel Gated Resistor Structure

Since the critical requirement of the gated resistor is being able to deplete the channel from the gate, according to another preferred embodiment of the present invention, a Recessed Channel Gated Resistor (RCGR) structure is proposed. According a preferred embodiment of the present invention, one potential RCGR structure resembles the previous design but includes a vertical high-low doping profile. Higher doping concentration at the surface can be used for the S/D regions to lower the contact resistance without being limited by the maximum depletion thickness required for the channel. The channel region thickness can be controlled by vertical recess etch to expose the lower doping region to meet the maximum depletion width requirement. According to another preferred embodiment of the present invention, the semiconductor layer for realizing the RCGR may have substantially uniform doping concentration instead of a high-low profile, where the doping concentration is sufficiently high for low contact resistance requirement while the channel region thickness can still be controlled by vertical recess etch to meet the maximum depletion width requirement. Essentially, this recess channel design decouples the competing doping level requirement for S/D and channel, and can reduce the contact and series resistance without changing the channel design concept described before. Since the channel recess process is low temperature, it can be done after wafer bonding with precise alignment to the acceptor wafer to fit in the BSMC methodology.

Figure 7A:
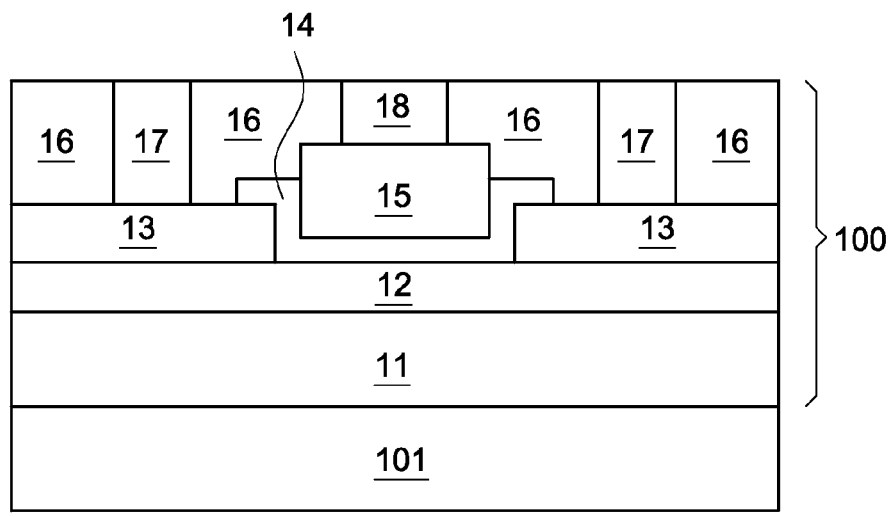
FIG. 7A shows the sectional view of the RCGR structure according to a preferred embodiment of the present invention.

The RCGR structure according to a preferred embodiment of the present invention is shown in FIG. 7A. Before the structure shown is described in more detail, it should be note that the drawings are for illustration purpose and are not drawn to scale. All the rectangular angle and shapes shown in this figure are used for demonstration. The rectangular angle and shapes can be rounded due to the actual process. Moreover, as used herein, the term terms "above" and "below" refer to respective sides of a component, i.e., "above" refers to one side of the component, and "below" refers to the opposite side of the component. But note: "above" and "below" are, as used herein, subjectively defined and not dependent on any particular orientation of the shown device as a whole. Moreover, when layer A is described to be placed above layer B, it does not mean the layer A is directly in contact with the layer B, and several inter-layers may be present between the two layers. Moreover, when layer A is mentioned to be placed above layer B, it does not mean that a physical boundary is present in the two layers. For example, the layer A and the layer B can be referred to a peak portion and a tail portion of a graded distribution of dopants from one implant, multiple implants, epitaxial growth or combination of all.

As shown in FIG. 7A, the RCGR structure 100 is formed on a substrate 101, where the substrate 101 can be semiconductor, dielectric, organic film or combination thereof, which can serve the function of mechanical support. Moreover, in 3D integration, the substrate 101 can be an acceptor wafer and further comprises at least one alignment mark and at least one semiconductor element covered with dielectric layer. The alignment mark can be used as reference for further processing of a donor wafer for forming the RCGR structure 100.

The RCGR structure 100 further comprises an isolation layer 11 arranged on the substrate 101 and having a first face and a second face opposite to the first face and beside the substrate 101. The isolation layer 11 can be: an isolator such as oxide, a semiconductor but with different doping type as the silicon layer 12 above, or a combination of both to resembles the "bulk" and "SOT" type gated resistor structures described in FIGS. 4A to 4D. A first silicon layer 12 is arranged on the first face of the isolation layer 11 and having a predetermined doping level, and a second silicon layer 13 is arranged on the first silicon layer 12 and having a doping level higher than or similar to that of the first silicon layer 12. For example, the predetermined doping level of the second silicon layer 13 is higher than or equal to $4\times10^{19}/cm^3$ or the doping level of the first silicon layer 12 is lower than or equal to $4\times10^{19}/cm^3$.

The doping profile of the first silicon layer 12 and the doping profile of the second silicon layer 13 can be created by implant, epitaxial growth or combination thereof. The second silicon layer 13 has the same polarity of doping as the first silicon layer 12. For example, when the first silicon layer 12 has n type doping, the second silicon layer 13 also has n type doping. Note that the high-low doping profile for layer 12 and layer 13 can be created by epitaxial growth with in-situ doping, by implants or combination of both. There are indeed several ways to form such high-low or uniform doping profile as illustrated in layers 13 and 12, for example, one implant can be used to form a Gaussian distribution graded distribution with peak location as layer 13 and its tail as layer 12. Two separate implants can also be used for form layers 12 and 13 separately. In-situ doped epitaxial layer can also be used. Overall, variations of such vertically graded junction should be included in this invention because people who skilled in this field will know the spirit of this invention is to create a vertical graded doping layers with recessed region to satisfy both the gate control and low contact resistance requirement.

Figure 7B:
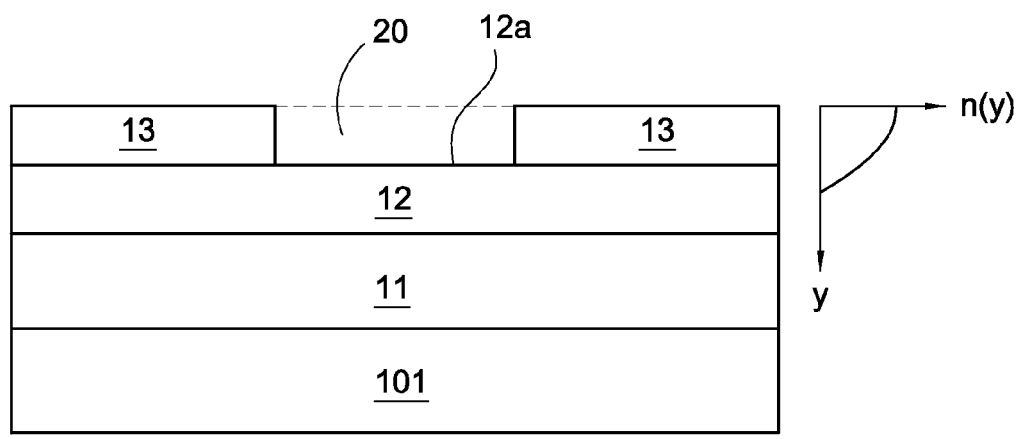
FIG. 7B shows a way to form recess in the RCGR structure of FIG. 7A.

With reference also to FIG. 7B, a recess 20 is defined in the second silicon layer 13 to expose the first silicon layer 12. A gate dielectric 14 is arranged in the recess 20 and covers the exposed face 12a of the first silicon layer 12. A gate (or gate layer) 15 is arranged on top of the gate dielectric 14 and placed within the recess 20. The gate 15 can be metal or semiconductor or combination of both. More particularly, the material of the gate 15, gate dielectric 14 and the first silicon layer 12 have a combined gate work function providing equivalent "opposite doping polarity" from that of the first silicon layer 12. For example, the combined gate work function at room temperature (~27° C.) is larger than 4.65 eV for n type first silicon layer 12 or smaller than 4.65 eV for p type first silicon layer 12.

The RCGR structure 100 further comprises at least one first electrical contact 17 electrically connected to the second silicon layer 13; and at least one second electrical contact 18 electrically connected to the gate 15; and dielectric layer 16 as electrical isolation. The dielectric layer can also be engineered as a strain layer to provide mobility enhancement to the carriers in the channel. As shown in FIG. 7A, the second silicon layer 13 is separated by the recess 20 and formed into source region and drain region, and the two first electrical contacts 17 electrically connected to the source region and drain region function as source/drain electrodes, respectively. The second electrical contact 18 electrically connected to the gate 15 functions as gate electrode. Moreover, even though not shown in this figure, people skilled in the related art know that multi-gate structure can also be used in the RCGR structure 100 shown in FIG. 7A to provide tight gate control over the channel.

With reference also to FIG. 7B, according to a preferred embodiment of the present invention, the donor wafer before bonding to the acceptor wafer includes the first silicon layer 12 and an intact second silicon layer 13 (as shown by the dashed line). As stated before, two major high-temperature processes (getting a high quality single crystal layer and dopant activation) limit the feasibility of monolithic stacking integration. As a result, in this invention the donor wafer is first processed by relatively high temperature process to form the first silicon layer 12 and an intact second silicon layer 13, and then bonded to an acceptor wafer contains at least one alignment mark and one semiconductor element (such as transistor or optical components). The following processes of the bonded layers from the donor wafer are relatively low temperature process (lithography, deposition and etching) to form the recess 20, the gate dielectric 14, and the gate 15 and so on. Therefore, the circuit on the acceptor wafer will not be degraded. When the RCGR structure 100 is intended to use in applications demanding lower contact resistance, the first silicon layer 12 and the second silicon layer 13 with higher doping concentration can be formed by implant with Gaussian or other graded distribution with peak concentration substantially inside the second silicon layer 13. The formation of the recess 20 to expose underlying first silicon layer 12 naturally reduces the channel thickness. In comparison with the embodiment shown in FIGS. 4A-4B, the RCGR structure 100 shown in FIG. 7A has good contact of high-doping source/drain regions (provided by the second silicon layer 13 with higher doping concentration) and relaxed requirement for thin channel thickness (due to etch-away a portion of the second silicon layer 13 to expose the underlying first silicon layer 12). Most importantly, the proposed RCGR structure relaxes the fabrication difficult for thin film processing and handling of the un-recessed gated resistor structures. Moreover, the donor wafer originally has the first silicon layer 12 and the intact second silicon layer 13, which have already been implanted and annealed, and the donor wafer can be treated as blank film to bond to an acceptor wafer without the need for precise alignment. After bonding, alignment and active region etch is performed to open the layers for further fabrication. Because etching off a layer requires a lower temperature than growing or annealing a layer, by pre-fabricating all the required layers with standard high temperature process and etching them afterwards, significant thermal budget can be saved. Essentially, by using the gated resistor structures shown in FIG. 7A, the conventional self-aligned S/D implant and activation process is eliminated and just one low temperature recess formation can be used to simultaneously define the S/D and gate region. Therefore, the RCGR structure 100 shown in FIG. 7A can be used in 3D integration and has the advantages of low thermal budget from wafer bonding and high interconnect density from monolithic stacking.

Figure 8A:
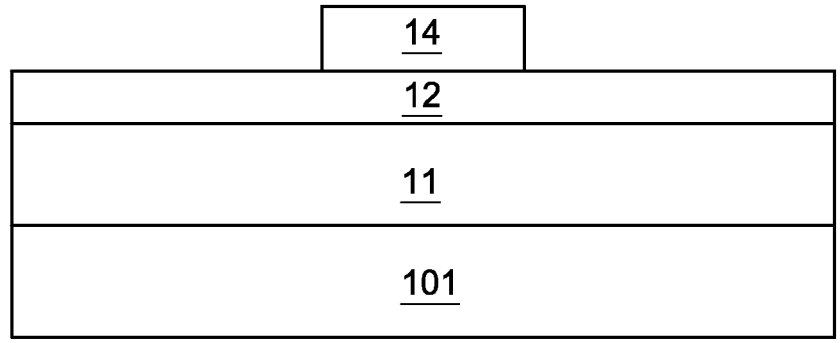
FIGS. 8A and 8B show another way for forming the gate dielectric in the RCGR structure according to another preferred embodiment of the invention.
Figure 8B:
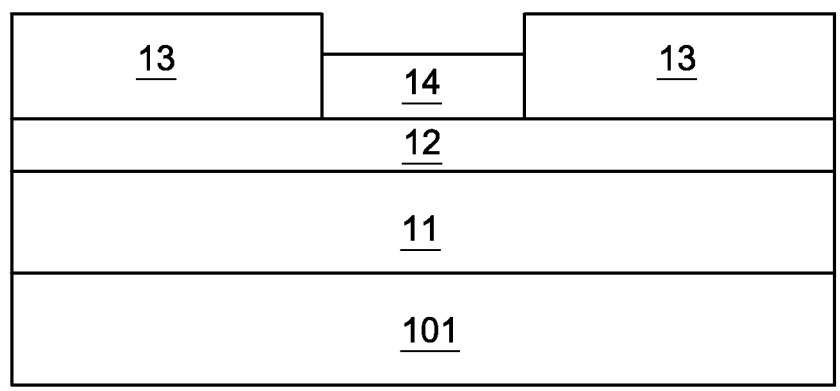

Moreover, even though the first silicon layer 12 and the second silicon layer 13 are shown as different layers in FIG. 7A, they can have no physical boundary therebetween. For example, one implant followed by annealing can be used to form graded impurity distribution in the donor wafer. As shown of the side of FIG. 7B, the graded dopant distribution n(y) has peak at the second silicon layer 13 and the tail of the graded distribution extends in the first silicon layer 12. By controlling the dopant distribution profile, the recess depth, and the gate material, the RCGR structure 100 can be tailored to provide combined gate work function with equivalent opposite doping polarity from that of the first silicon layer 12. Besides etching the second silicon layer 13 to form recess 20 in the RCGR structure 100, selective epitaxial growth can also be used to fabricate the structure shown in FIG. 7A. With reference to FIG. 8A and FIG. 8B, the donor wafer can be originally formed with the first silicon layer 12 (namely a doped semiconductor layer formed by relatively high-temperature process such as implant/activation). After the donor wafer is bonded to the substrate 101 (acceptor wafer), a dielectric layer 14 is formed by low temperature process (such as high dielectric constant dielectric deposition and lithograph) and then the second silicon layer 13 is formed on the resulting structure by selective epitaxial growth. Note this selective epitaxial growth is done after bonding and hence is different from the ones describe before which are done before bonding as one of the methods to form the vertically graded doped layers.

It should be noted that the above descriptions for the first silicon layer 12 and the second silicon layer 13, and their dopant distribution are only possible ways for realizing the RCGR structure 100 and are not limitations for the scope of the subject application. For example, for the first silicon layer 12 and the second silicon layer 13 shown in FIG. 7B, they may have substantially uniform dopant distribution rather than the graded dopant distribution. Many doping profiles, including high-low, uniform, low-high can all be used under the "recessed channel gated resistor for 3D integration" concept. In other words, the resulting structure can still perform as a functional recessed channel gated resistor as long as the first silicon layer 12 under the recess 20 (namely a recessed portion under the exposed surface 12a of the first silicon layer 12 and atop the isolation layer 11) is sufficiently thin so that the gate control can still be used to deplete the channel. That is, the region beneath the recess 20 can be fully depleted to form a high resistivity region. In other words, the electron/hole potential of the channel region can still be controlled by the external bias from the gate with appropriate gate work function, even though the semiconductor layers atop the isolation layer 11 has different doping profiles.

Manufacturing Process for RCGR Structure in 3D Integration Application

The structure shown in FIG. 7A can be fabricated by a manufacturing method according to another preferred embodiment. In the manufacturing method of the present invention, before bonding and layer transfer, multi-layers can be doped with higher peak doping concentration in the donor wafer. After transferring the layers from donor wafer to acceptor wafer, the channel region is defined with alignment to the underlying layer of the acceptor wafer, followed by a recess etch. Because the gated resistor primarily relies on bulk conduction rather than surface conduction, it might not be as sensitive to the surface quality as the conventional MOSFET. Many process choices can be used for the recess etch, for example, a dry etch followed with a wet etch surface clean or by low temperature plasma oxidation for good thickness controllability and selectivity to the wet etch.

Figure 15:
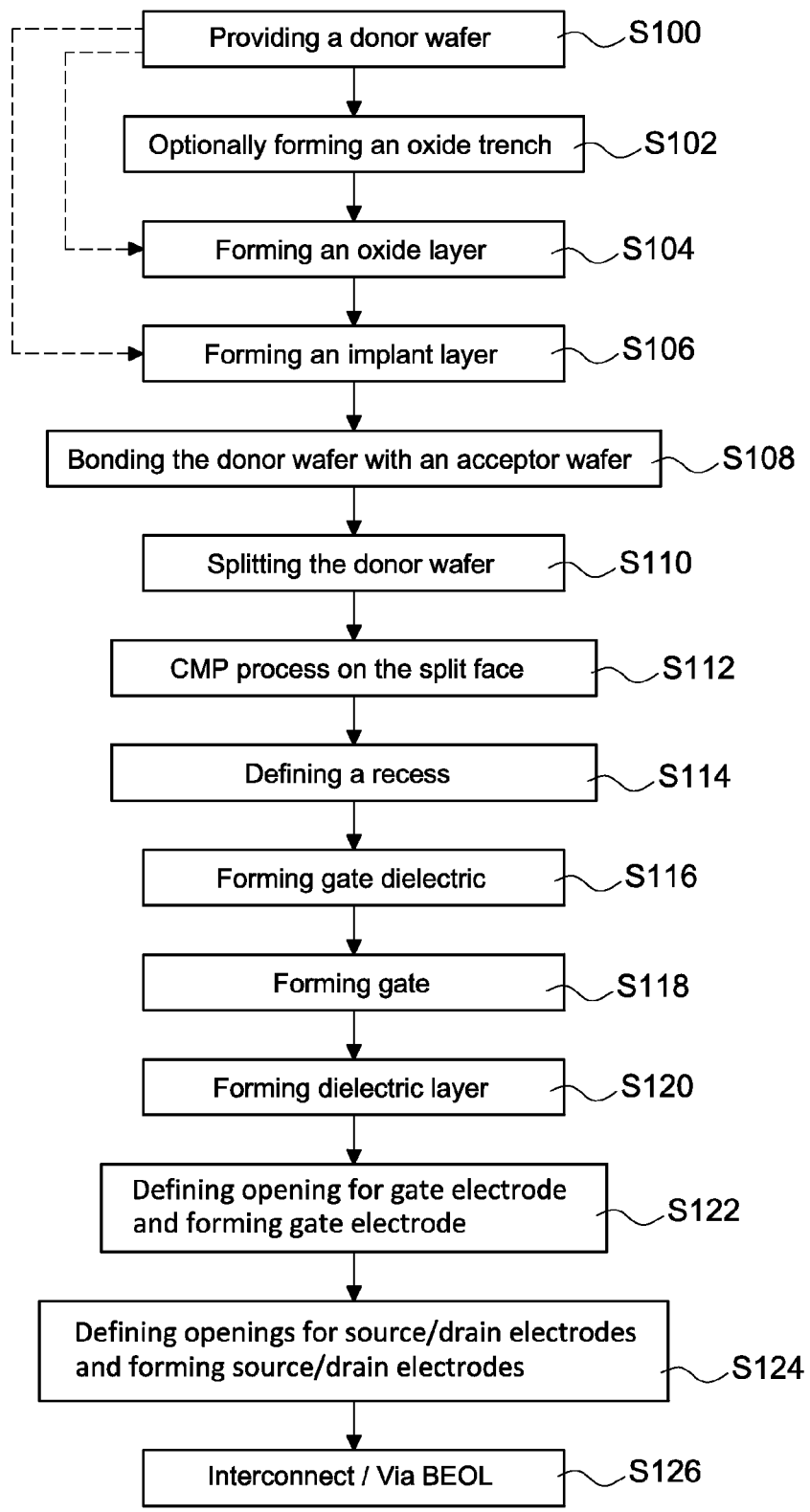
FIG. 15 is a flowchart to show some feasible manufacturing steps according to another preferred embodiment of the present invention.

With reference to FIGS. 9A to 9L, and also to FIG. 15 a method for forming the RCGR structure 100 first on a donor wafer and using the donor wafer with an acceptor wafer to achieve 3D integration is depicted. Note that these figures are for illustration purpose for explaining this invention and are not drawn to scale. For example, the recess depth can range from ultra thin (less than 1 nano-meter) to a substantial amount (larger than tens of nano-meter) depends on the process involved to create the recess. All the rectangular angle and shapes shown in this figure are used for demonstration. The exact layer to layer boundary and shape could be varied depending on the actual process condition and mask design. The rectangular angle and shapes can be rounded due to the actual process and the actual layer coverage on another layer depends on the corresponding mask design. Similar modifications should still be within this invention as long as the recessed channel gated resistor structure is involved for the actual 3D integration.

Figure 9A:
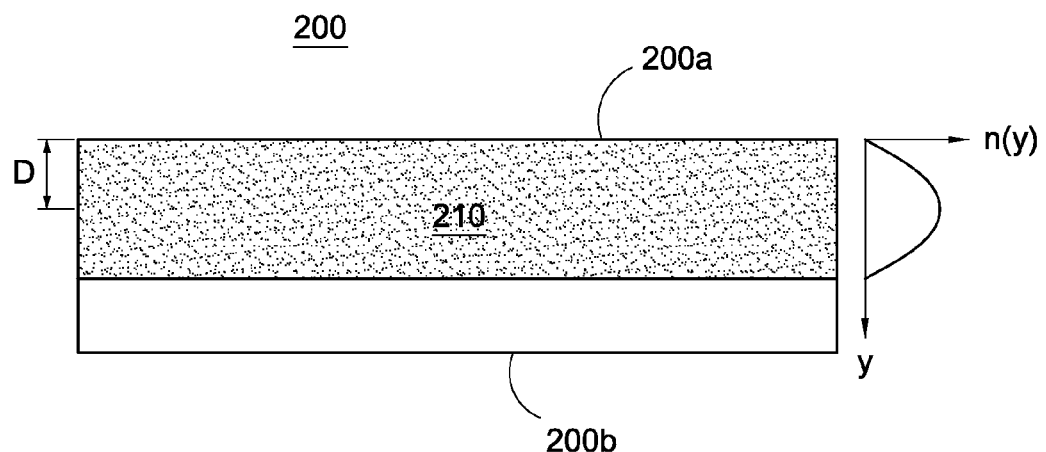
FIGS. 9A to 9L show the steps for manufacturing the RCGR structure according to a preferred embodiment of the present invention.
Figure 9B:
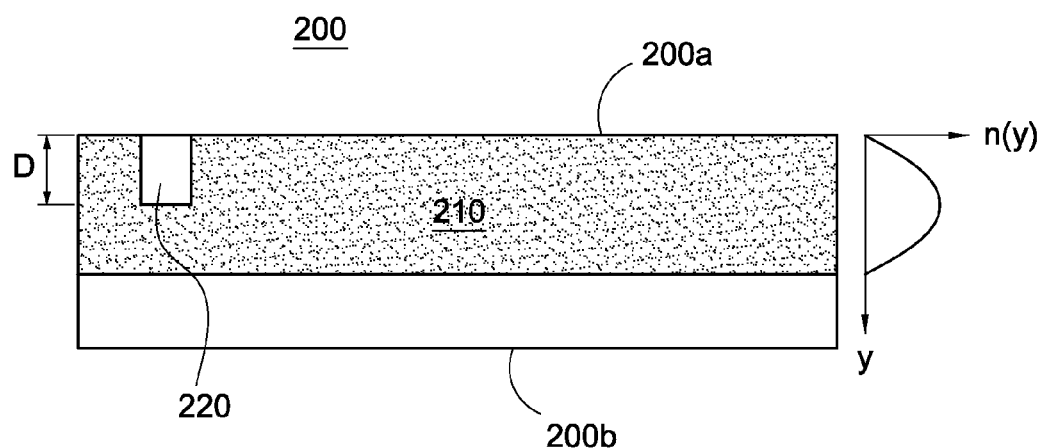

As shown in FIG. 9A, a donor wafer 200 with a first face 200a and a second face 200b opposite to the first face 200a is provided (Step S100). The donor wafer 200 has at least one buried doped layer 210 on the first face 200a with a peak concentration, where the peak concentration has a predetermined depth D from the first face 200a, and the buried doped layer 210 has a specific dopant concentration distribution. For example, the dopant concentration distribution is, but not limited to, Gaussian distribution. As an optional process step which can be beneficial to the fabrication but not essential, in FIG. 9B, oxide trench 220 can optionally be created by using etching and refill to mark the depth D of the doping profile (Step S102). The oxide trench 220 can be designed to match the implanted doping profile depth so that during a later CMP step after split, the polish can stop at the desired doping depth D for better process control.

Figure 9C:
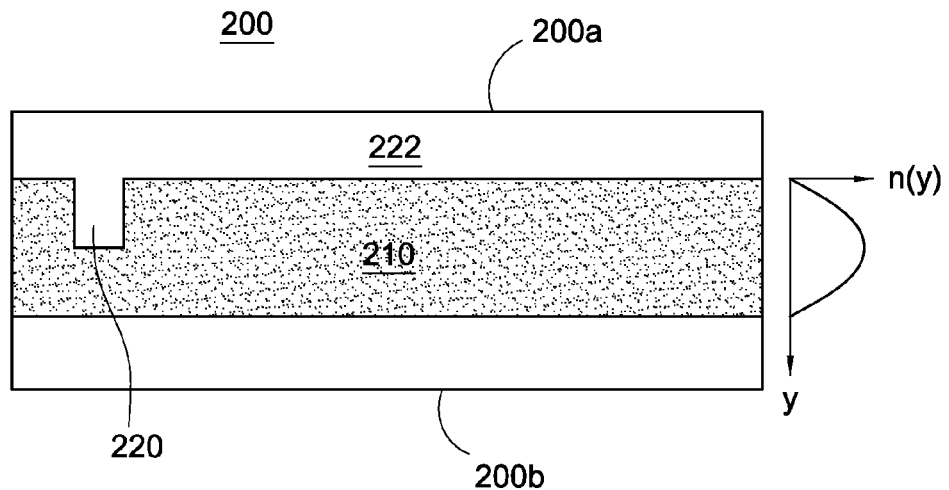
Figure 9D:
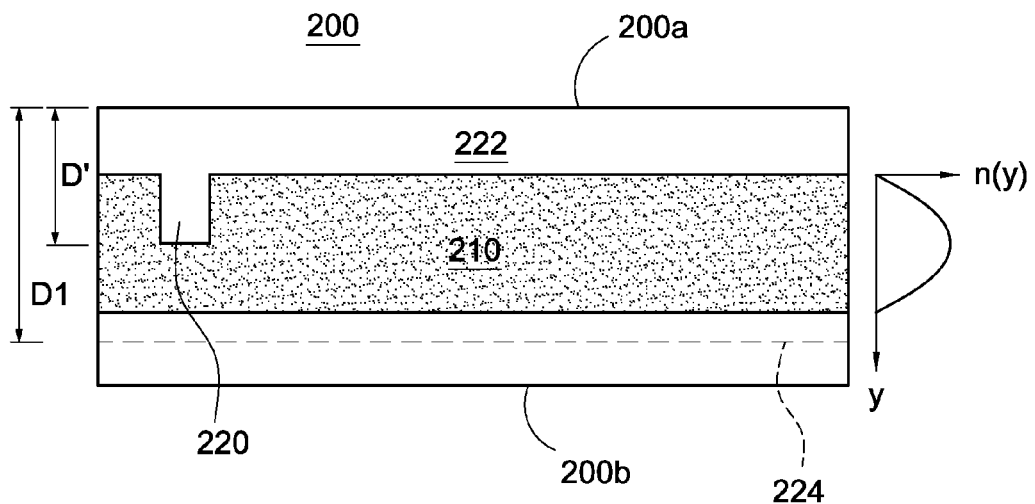

Afterward, as shown in FIG. 9C, an oxide layer 222 is formed on the first face 200a to cover the buried doped layer 210 (Step S104). As shown in FIG. 9D, Hydrogen, or other species, can be implanted into the donor wafer 200 through the first face 200a (Step S106) and the hydrogen implant 224 has an implant depth D1 deeper than the depth D' (the above-mentioned doping depth D plus the thickness of layer 222) of the dopant profile of the buried doped layer 210. The Hydrogen implant 224 is used to facilitate a following smart-cut process to remove portion of the donor wafer 200 after the donor wafer 200 is bonded to an acceptor wafer on the first face 200a, which will be detailed later.

Figure 9E:
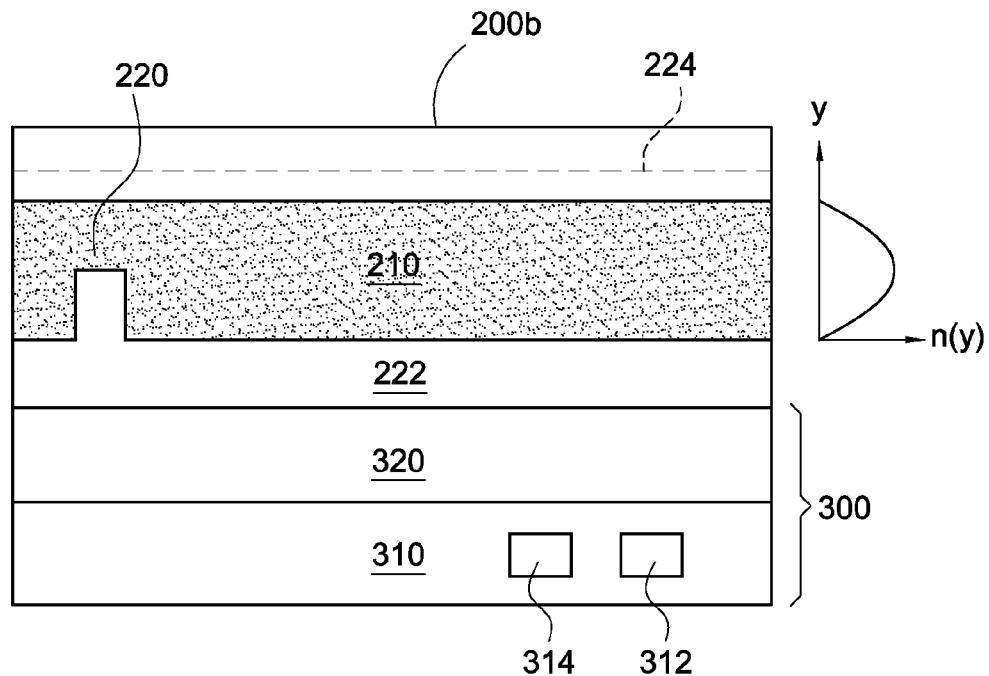
Figure 9F:
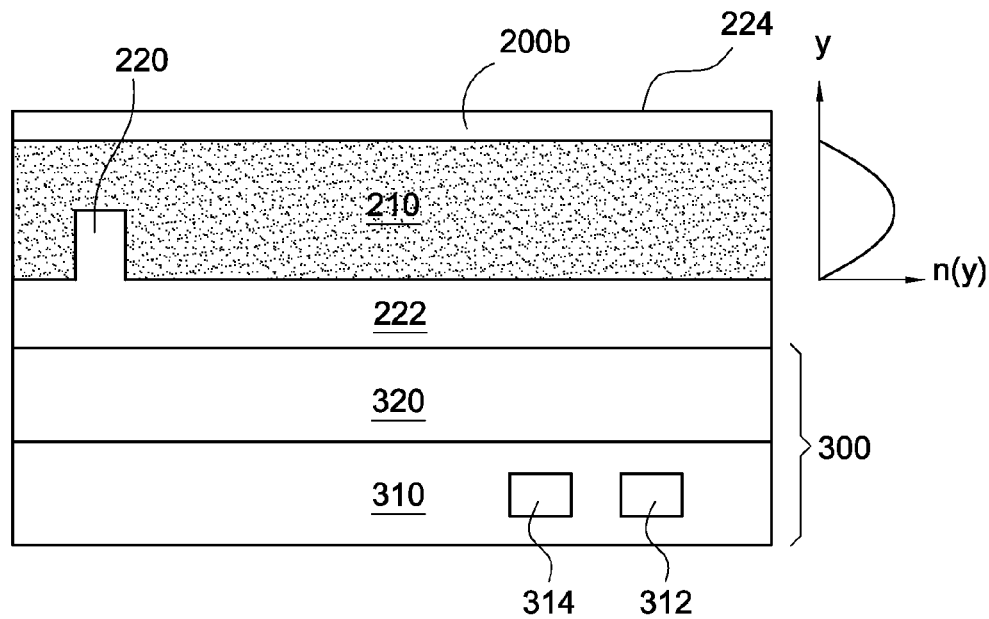

As shown in FIG. 9E, the resulting structure is bonded to an acceptor wafer 300 on the first face 200a (Step S108). Also shown in FIG. 9E, the acceptor wafer 300 comprises an acceptor substrate 310 and an acceptor oxide layer 320, where the oxide layer 222 is bonded to the acceptor oxide layer 320. More particularly, the acceptor substrate 310 also comprises at least one alignment mark 312 and at least one semiconductor element 314 (such as a transistor or optical components). Afterward, as shown in FIG. 9F, a portion of the donor wafer 200 is removed by splitting the donor wafer 200 at the hydrogen implant 224 (Step S110). The surface of the donor wafer 200 opposite to the first face 200a is polished by, for example, a CMP process to remove roughness thereon (Step S112). In the CMP process, if the optional oxide trench 220 is also formed in step S102, it can be used as a stop mark to stop the CMP process to improve the stopping mechanism of this CMP process. Hereinafter the portion of the buried doped layer 210, which is exposed by the CMP process or etch process, is referred to as doped layer 210' for further demonstration.

Figure 9G:
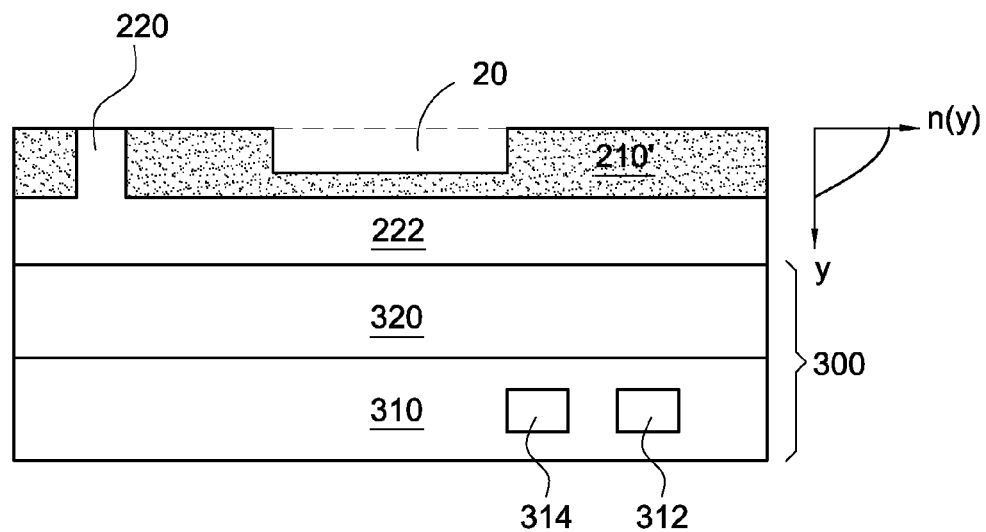
Figure 9H:
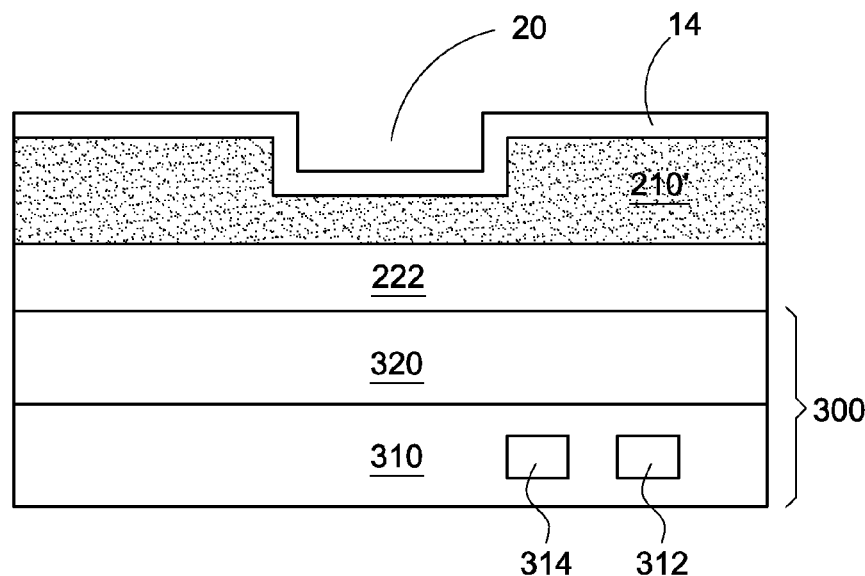
Figure 9I:
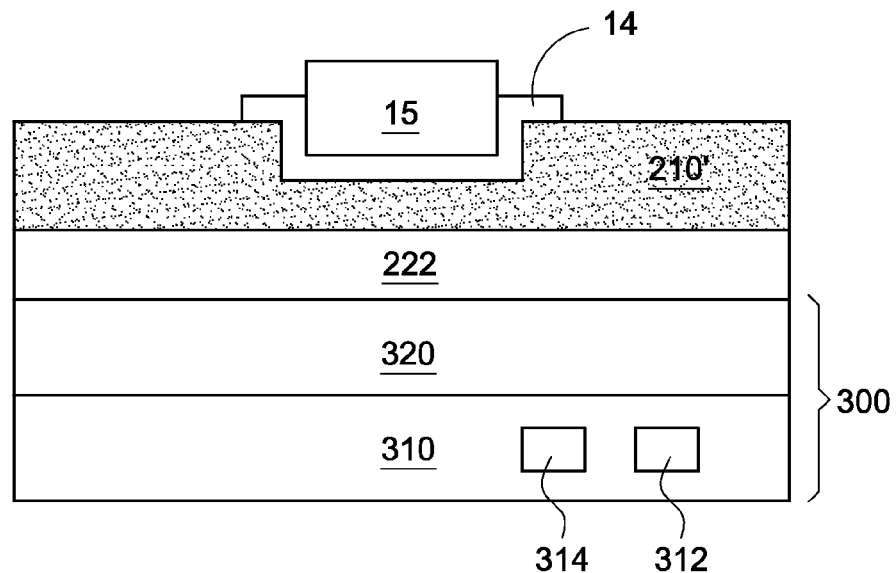

As shown in FIG. 9G, a lithography process is performed on the exposed face of the doped layer 210' with reference to the acceptor wafer 300, and a recess 20 is defined on the exposed face of the doped layer 210' by etching. (Step S114). After the CMP process or etching process, the doped layer 210' has substantially high dopant concentration at the exposed surface thereof. It should be noted the dopant shown in FIG. 9G is only for demonstration and the peak can be located below the upper surface of the doped layer 210'. Moreover, as mentioned before, the RCGR structure 100 is not limited to the graded dopant distribution shown in FIG. 9G and can have other kind of dopant distributions such as uniform dopant distribution or step dopant distribution. Moreover, the optional oxide trench 220 is used for stop mark of the CMP process and is not as critical after step shown in FIG. 9G. Therefore, the optional oxide trench 220 will not be depicted in subsequent drawings for simplicity of demonstration. After the lithography process, an optional surface treatment (such as low temperature plasma oxidation and wet etch) can be conducted to provide smooth surface and repair damage caused by previous etch steps. After the lithography process, as shown in FIG. 9H, a gate dielectric 14 is formed atop the exposed surface of the doped layer 210' (Step S116), where the gate dielectric 14 can be formed by low temperature atomic layer deposition (ALD), plasma oxidation or can be other dielectric film. As shown in FIG. 9I, a gate material is deposited on the gate dielectric 14 and then the gate material is processed by a lithography process to form a gate layer 15 in the recess 20 (Step S118). It should be noted that the gate 15 does not need to be as big as the recessed 20 (exact size of gate should not be limited by this drawing). For the gate material, if poly semiconductor such as Si is used, an implant and low temperature anneal can also be used. Moreover, the gate material can also be metal such as Al or combination of metals to provide the appropriate work function. Namely, the material of the gate 15, the thickness and material of dielectric 14, and the exposed surface of the recess 20 have to provide an equivalent gate work function with equivalent opposite doping polarity from the doped layer 210'. For example, the combined gate work function at room temperature for Si channel is larger than 4.65 eV (p type like) for n type doped layer 210' or smaller than 4.65 eV (n type like) for p type doped layer 210'.

Figure 9J:
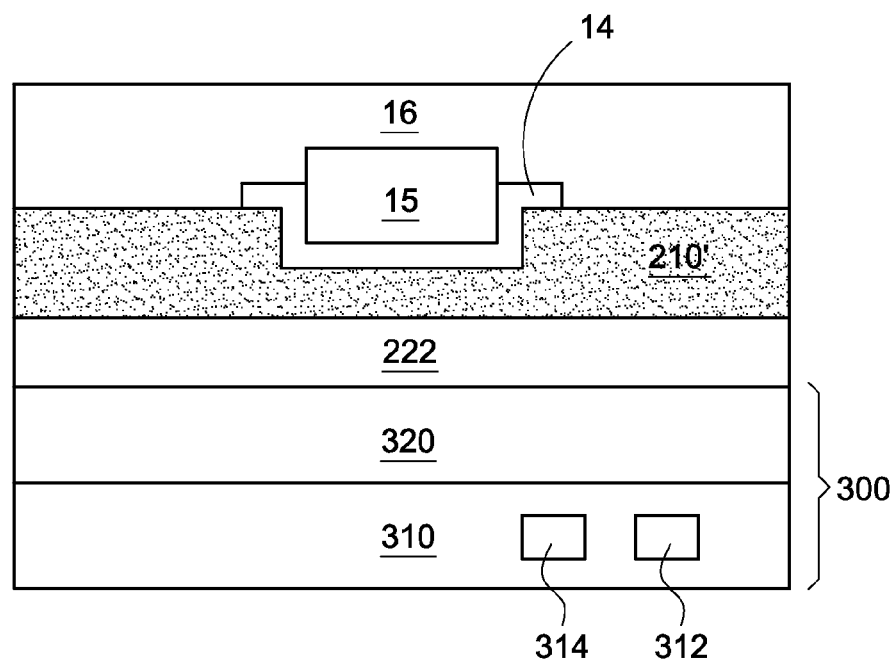
Figure 9K:
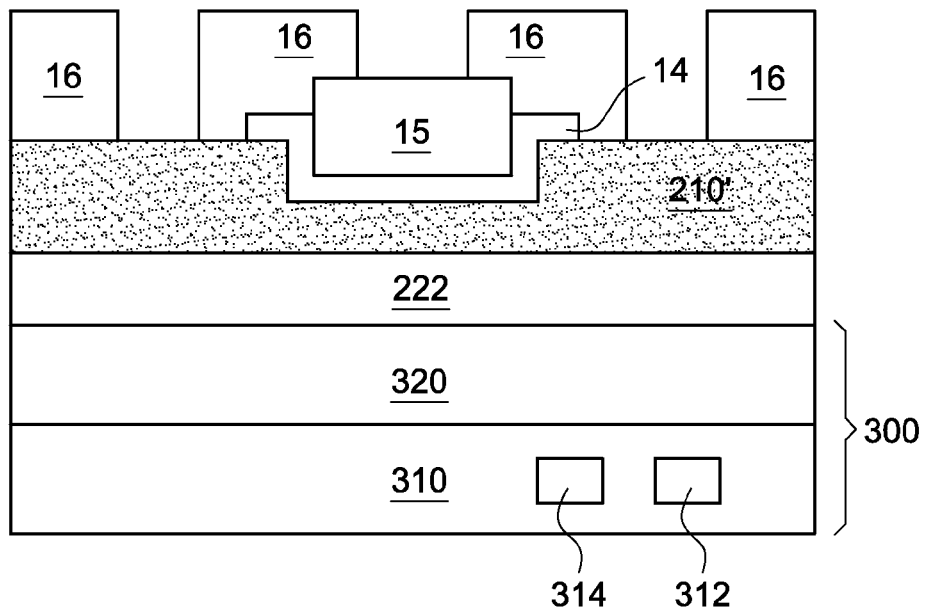
Figure 9L:
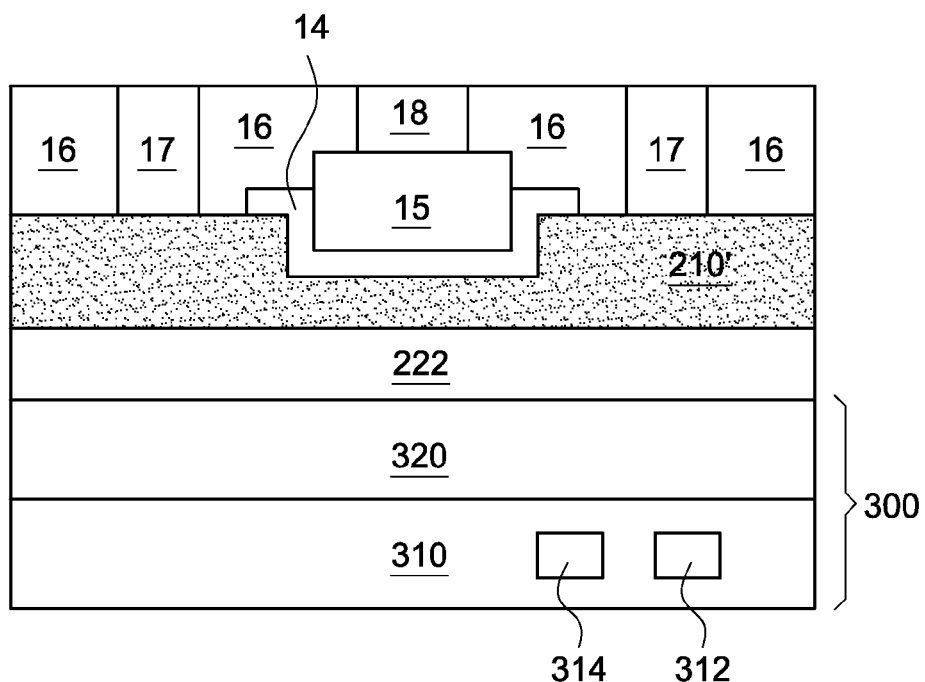

After the gate 15 is formed, as shown in FIG. 9J, a dielectric layer 16 is formed atop the resulting structure (Step S120), and an optional CMP process can be conducted to planarize the surface after the dielectric layer 16 is formed. As shown in FIG. 9K, lithography processes can be performed on the dielectric layer 16 with reference to the acceptor wafer 300 to define opening for gate electrode and then forming the gate electrode 18 as shown in FIG. 9L (Step S122). Afterward, another lithography processes can be performed on the dielectric layer 16 with reference to the acceptor wafer 300 to define openings for source/drain electrodes and then forming the source/drain electrodes 17 as shown in FIG. 9L (Step S124). Optionally, a silicide process such as cobalt (Co) or nickel (Ni) based silicide process can be used to provide better electrical contact.

Figure 10A:
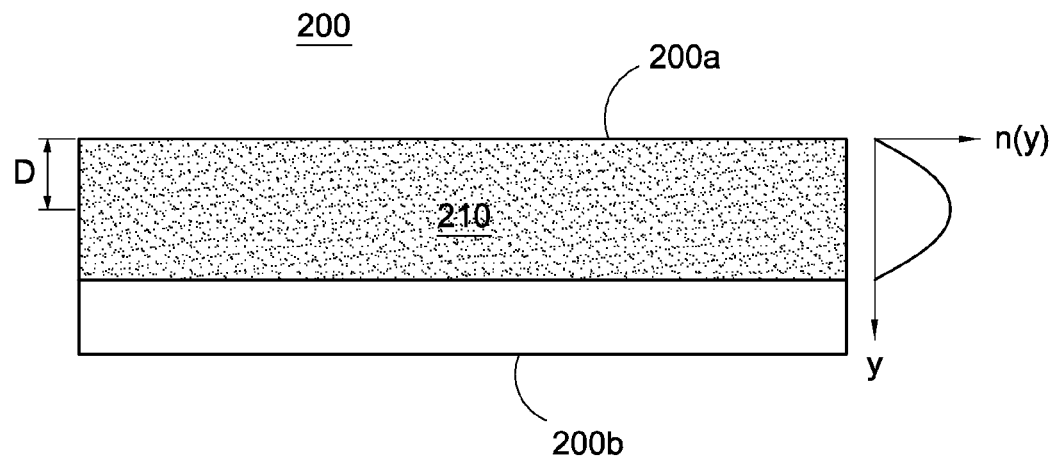
FIGS. 10A to 10F show the steps to replace FIGS. 9A to 9G in the process for manufacturing the RCGR structure according to another preferred embodiment of the present invention.
Figure 10B:
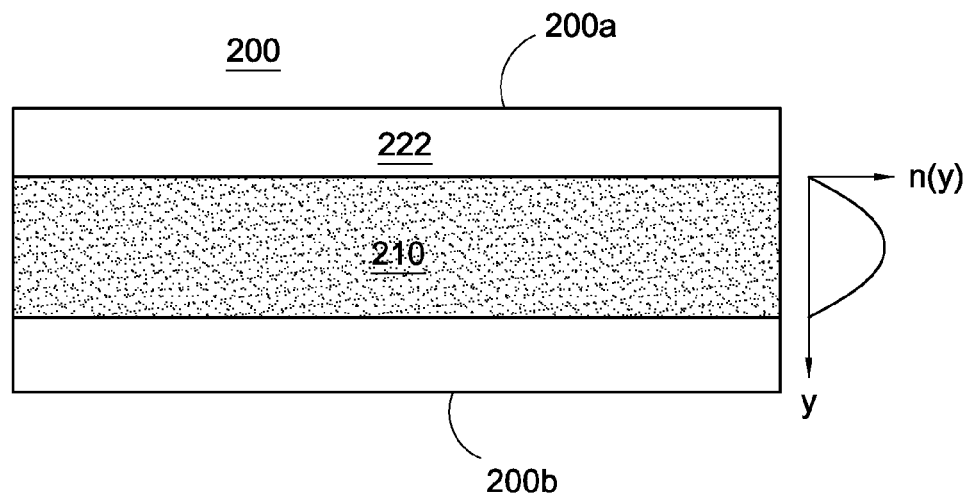
Figure 10C:
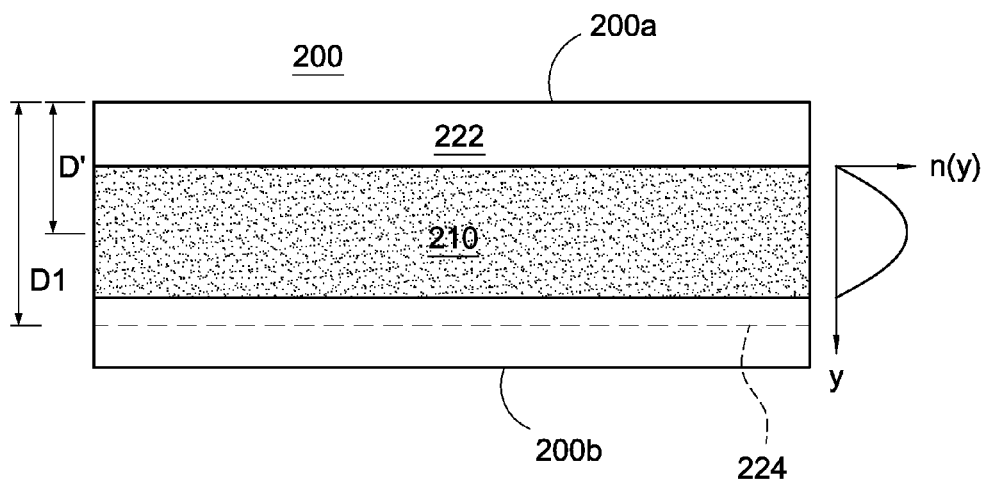
Figure 10D:
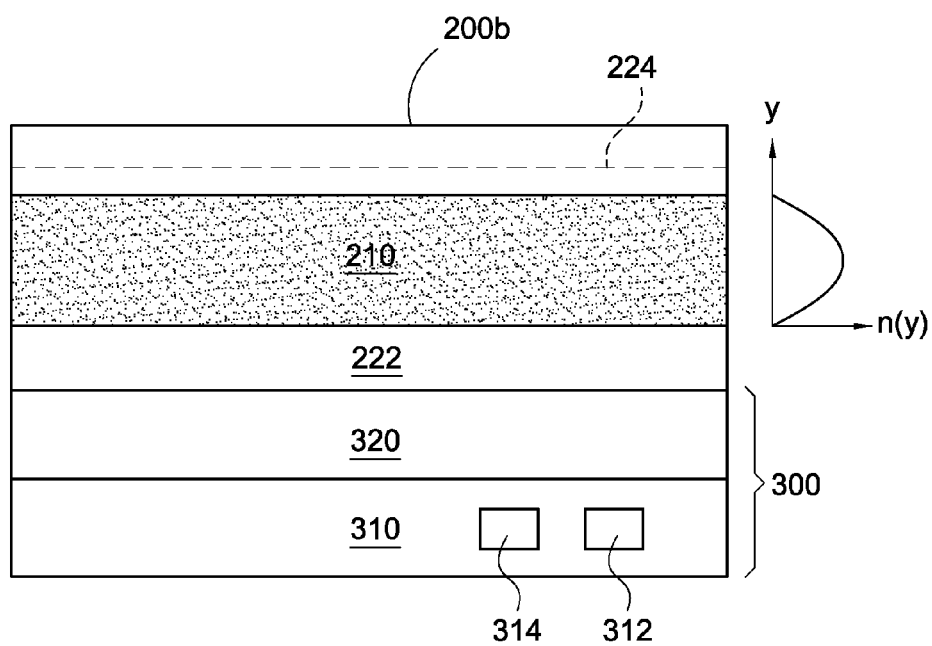
Figure 10E:
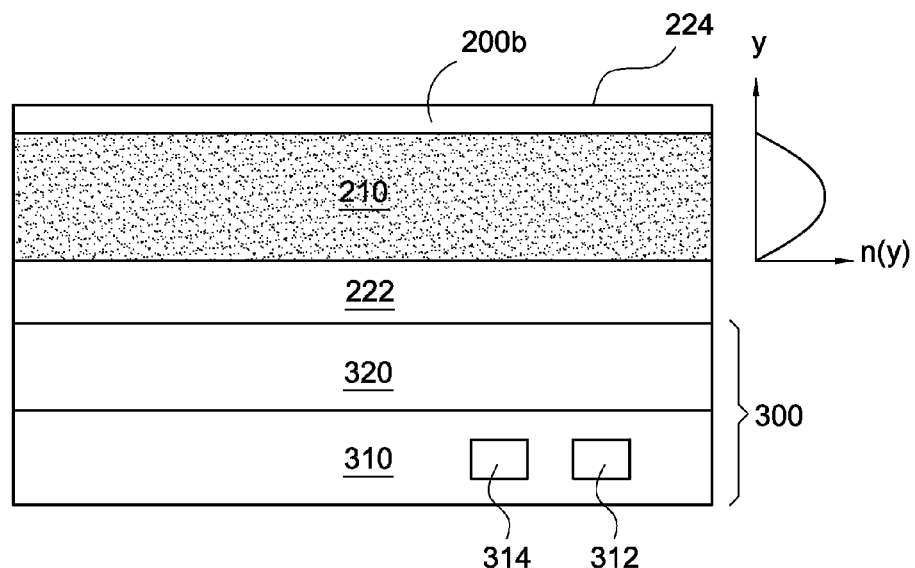
Figure 10F:
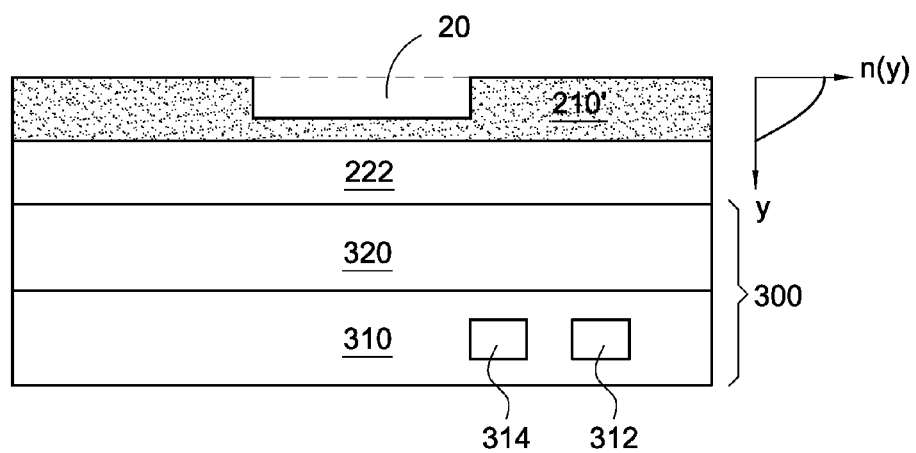

Moreover, FIGS. 10A to 10F shows partial processing steps according to another preferred embodiment of the present invention, where the oxide trench 220 used in embodiment shown in FIGS. 9A to 9L can be eliminated. As shown in FIGS. 10E and 10F, after the donor wafer is split at the hydrogen implant 224, a CMP process is conducted to remove the exposed portion of the buried doped layer 210 until a high doping face is exposed. Afterward, the steps shown in FIGS. 9H to 9L can be proceeded to fabricate the RCGR structure of the present invention.

Figure 11:
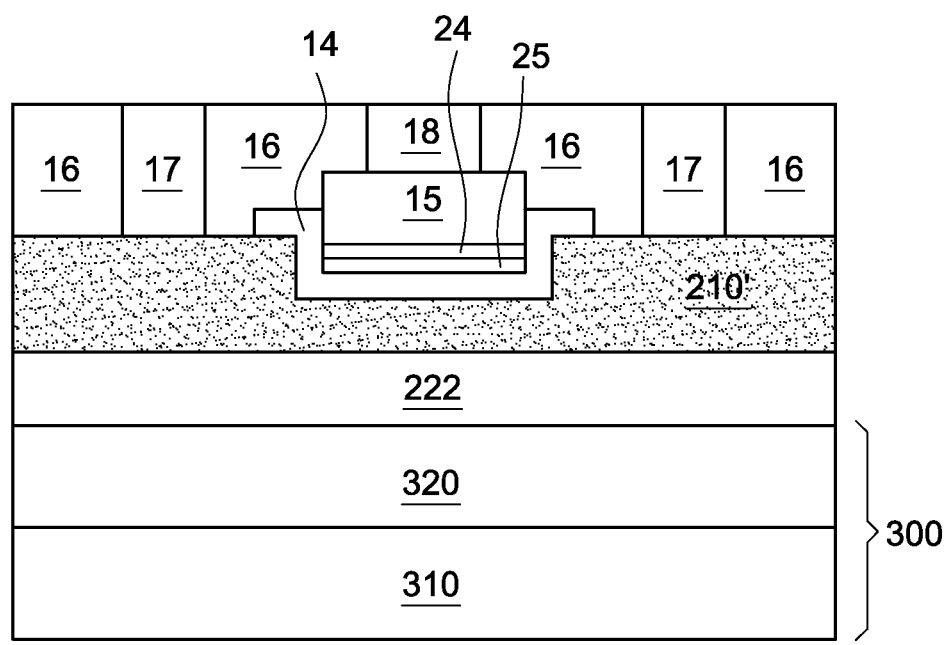
FIG. 11 shows the sectional view of the RCGR structure for realizing a non-volatile memory cell according to another preferred embodiment of the present invention.

Moreover, for the process shown in FIGS. 9A to 9L and FIG. 15, the steps S116 to S118 can be modified such that a floating gate is formed below the control gate as shown in FIG. 11. After the above mentioned Step S116, a layered-gate deposition (using nano-crystals or metal or nitride layer) is performed to form a floating-gate material layer on the gate dielectric 14, and then the floating-gate material layer is subjected to lithography process to form a floating gate 25. Afterward, a dielectric layer is formed atop the resulting structure and is then etched to form a dielectric overlay 24 atop the floating gate 25. Afterward, the processes similar to those of steps S118-124 can be conducted to form control gate 15, dielectric layer 16, and gate electrode 18 and source/drain electrodes 17.

Note the sequence of forming gate electrode 18 and source/drain electrodes 17 can be modified without changing the function of this invention. For example, gate electrode can be formed at the same lithography step as defining source/drain electrode. It can also be formed before or after source/drain electrode. Namely, the steps S122 and S124 shown in FIG. 15 can be switched with order or conducted at the same time.

Moreover, because after transferring the layers from the donor wafer to the acceptor wafer, all process steps are low temperature. It is thus feasible to switch the sequence of process steps. One further example of such sequence modification, other than the one listed above, is that S124 can also be performed anywhere after step S112 since S124 is a low temperature step and also does not change the topology of the recessed channel region.

As a remark, after the recessed channel gated resistor structure has been fabricated, subsequent via and interconnect which are used to connect to adjacent devices or different vertical layers can be fabricated. Moreover, electrical isolation between device and device, such as shallow trench isolation, could also be included but not discussed in detailed here because it is not the primary focus of this invention. Such modification and continuing process such as including isolation and via/interconnect to the RCGR structure should be considered variations of this invention and hence within the scope of this invention.

Figure 12A:
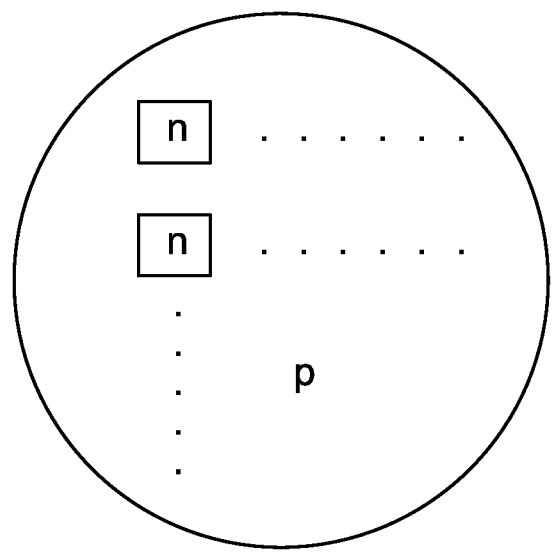
FIGS. 12A to 12D show the schematic diagram of forming well-defined implant to form locally opposite doping type regions for CMOS fabrication.
Figure 12B:
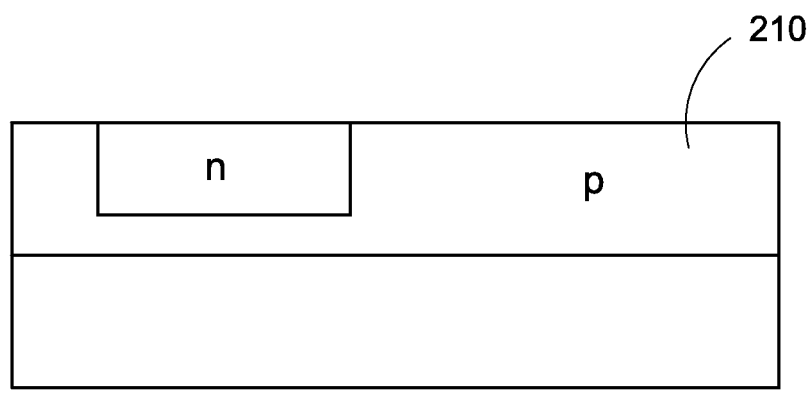
Figure 12C:
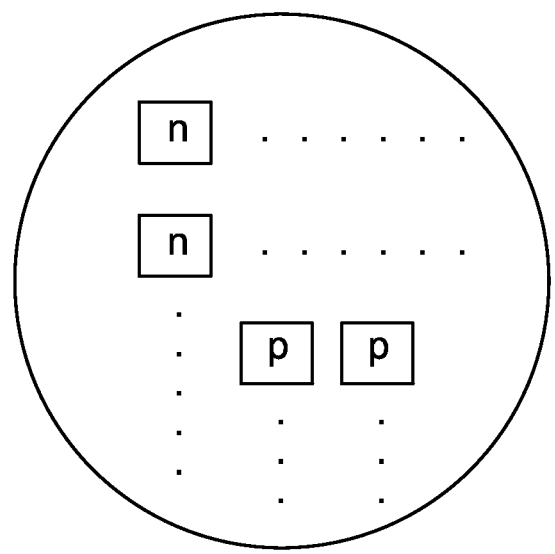
Figure 12D:
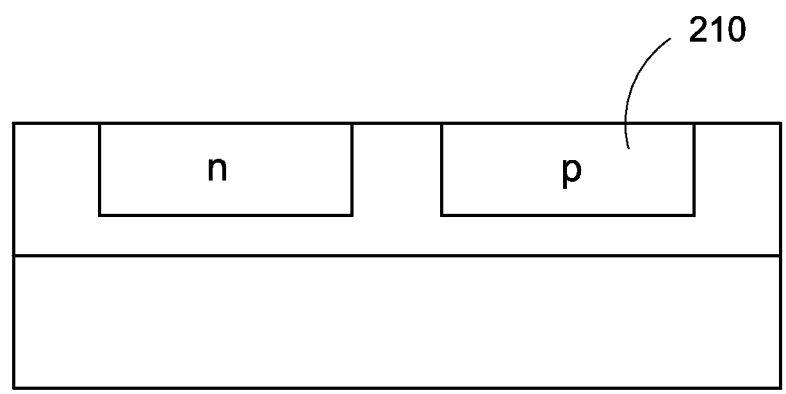

FIGS. 12A to 12D show the schematic diagrams of forming well-defined implant to form locally opposite doping type regions for CMOS fabrication. The donor wafer shown in FIG. 7A can be further doped with locally opposite doping type impurity for future CMOS fabrication. For example, if the donor wafer shown in FIG. 7A is initially doped with p type impurity, a plurality of n wells are also formed at the first face 200a as shown in FIGS. 12A and 12B. Because typically the n wells have sufficient large area, accuracy alignment is not necessary when the donor wafer is bonded to the acceptor wafer. It should be noted that the n, p polarity can be flipped in FIGS. 12A and 12B, namely, p well formed in n type doped layer 210. Alternatively, as shown in FIGS. 12C and 12D, multiple n wells and p wells can both be formed on the top face of the donor wafer. After both n well and p wells are formed, both n type and p type RCGR structures can be fabricated as described before.

Figure 13:
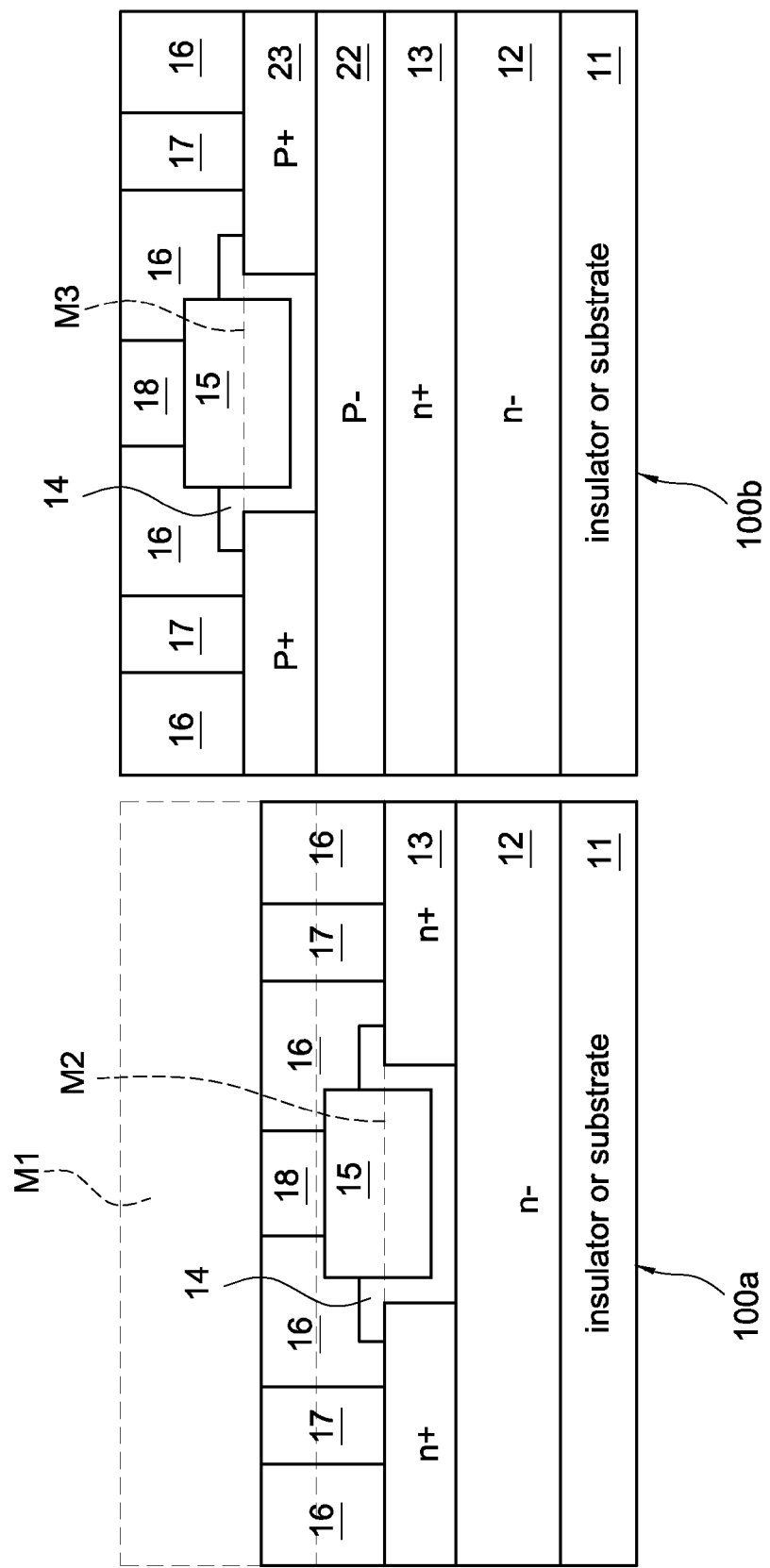
FIG. 13 shows the RCGR structure for realizing a CMOS transistor according to another preferred embodiment of the present invention.

FIG. 13 shows RCGR structure for realizing CMOS application according to another preferred embodiment of the present invention. The donor wafer can be originally provided with insulator 11, n− layer 12, n+ layer 13, p− layer 22, and p+ layer 23. After the donor wafer is bonded to the acceptor wafer, a lithograph process on a portion of the donor wafer to form a device recess M1 (see dashed line) such that the RCGR structure is divided into at least two portions 100*a* and 100*b*. The portion 100*a* has n type channel while the portion 100*b* has p type channel. Afterward, gate recesses can be formed on the n+ layer 13 and the p+ layer 23 respectively. People skilled in the related art can realize that processes similar to those shown in FIGS. 9H to 9L can be followed to fabricate a CMOS device on the donor wafer after bonding. It should be noted that the above recess-forming sequence can be varied. For example, the gate recess M3 for the p+ layer 23 can be first defined, and then the device recess M1 and the recess M2 for the n+ layer 13 can later be defend. The only criterion is that the device recess M1 has to be done before its associated gate recess M2.

Figure 14:
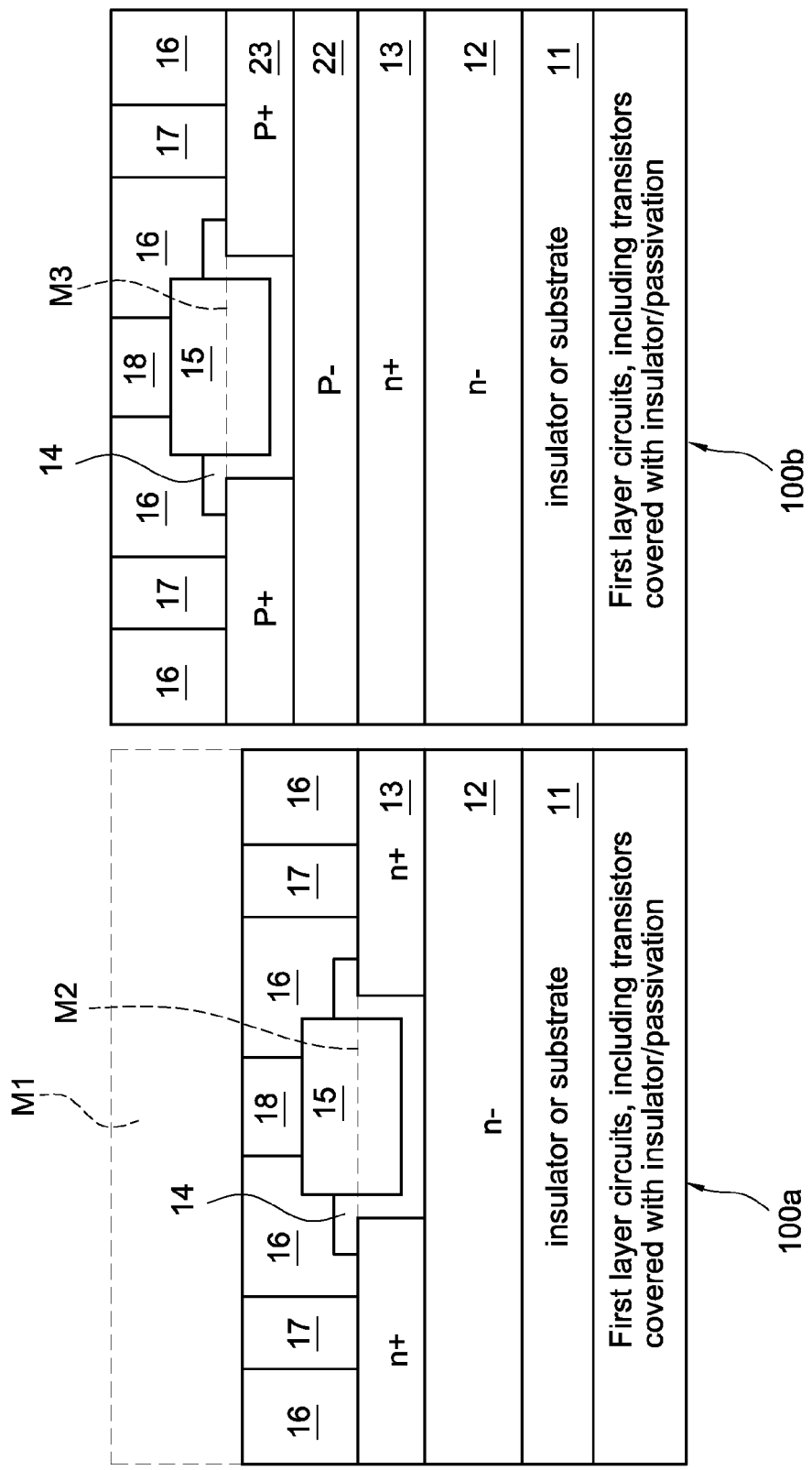
FIG. 14 shows the RCGR structure for realizing a CMOS transistor according to another preferred embodiment of the present invention.

FIG. 14 shows the application of the RCGR structure of FIG. 13 for 3D integration, according to another preferred embodiment of the present invention. As shown in this figure, the RCGR structure of FIG. 13 is arranged on first layer circuits, which include transistors covered with insulation/passivation layer. Therefore, CMOS devices can be advantageously fabricated on the underlying first layer circuits of the acceptor wafer with high interconnect density and low thermal budget.

Essentially, the primary concept proposed in this invention is to move the "forming a single crystal layer" and "forming vertical doped layers" steps which require high temperature but not precise alignment to "before bonding to another acceptor wafer". Doing so minimizes the thermal budget with almost no penalty from misalignment. Besides, since a conventional MOSFET structure requires S/D implant and activation self-aligned to the gate, by using the proposed recessed channel gate resistor structure, the S/D can actually be defined by "etching" into the vertical structures instead of "self-aligned implant and activation" of the conventional MOSFET. In other words, low temperature etching process is used to open layers for further device processing instead of using high temperature annealing or epitaxial growth. As dimension keeps marching toward atomic scale, lateral junction control and random dopant distribution can be problematic for the conventional MOSFET, but both of them could be relieved by the proposed gated resistor structures. "Vertical" process control, such as etch or deposition rate, instead of "lateral" process control usually involves using expensive state-of-the-art lithography tool, becomes the primary process consideration for this proposed process flow and device structure. This invention thus provides a practical way in achieving ultimate 3D integration.

To sum up, the recessed channel gated resistor structure according to the present invention has following advantages over prior arts:

1. High quality and high density of interconnects/via. In comparison with wafer-bonding/TSV 3D integration of which the interconnects/via quality and density are limited by the substrate thickness and bonding alignment accuracy, the interconnects/via of this invention can be fabricated by high-resolution lithography/etch process after the layers of the donor wafer are transferred to the acceptor wafer.

2. Low thermal budget single crystal layer transfer and S/D formation. The process steps requiring high temperature but not precise alignment to the acceptor wafer are moved before attachment. Doing so minimizes the thermal budget with almost no misalignment penalty. The S/D implant and anneal is equivalently done as the channel implant/anneal before attachment. As a result, after attachment, full transistor function can still be obtained with very low thermal budget based on the doped vertical structures.

3. Fewer lithography steps to reduce yield loss and process cost. The S/D region and the channel region have the same doping polarity in the proposed recessed channel gated resistor structure. As a result, the lithography steps for threshold voltage adjustment, halo implant or lightly doped drain (LDD) implant, and S/D implant could be eliminated to reduce yield loss and process cost.

4. Suitable for ultimate 3D integration, such as forming memory on top of existing logic circuits. The RCGR structure of the present invention can achieve high interconnect density with relaxed thermal budget requirement. It is also suitable to form a periodic array of devices, such as memory cells. A high communication bandwidth between different layers of processor cores and memory banks can be realized.

5. Combining the advantages of monolithic stacking (dense contact/accurate alignment) and wafer bonding (low thermal budget). The high temperature processes such as implant and annealing are conducted before the donor wafer is bonded to the acceptor wafer. The S/D region is defined by low temperature etching process rather than conventional high temperature implantation/activation process.

6. Relaxing the manufacture requirement of ultra thin film (<15 nm) processing and handling by proposing the recessed channel structure. It can achieve both good contact resistance (high S/D region) with tight gate control over the channel (thin channel region) without compromising in between due to process limitations.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An electrical switch using a recessed channel gated resistor structure, including:
    an isolation layer having a first face and a second face opposite to the first face;
    a doped silicon layer arranged on the first face of the isolation layer and having a recessed portion with reduced thickness, the doped silicon layer having a predetermined doping type, wherein the doped silicon layer has a substantially uniform doping profile with same doping concentrations along a direction horizontal to the isolation layer at same depths, respectively, and a doping concentration below an exposed surface of the recessed portion in the doped silicon layer is smaller than a doping concentration above a surface level of the exposed surface in the doped silicon layer;
    a gate dielectric covering at least part of the recessed portion of the doped silicon layer;
    a gate layer arranged atop the gate dielectric and covering at least part of the gate dielectric;
    at least one electrical contact connected to the doped silicon layer;
    at least one electrical contact connected to the gate layer;
    wherein the recessed portion in the doped silicon layer makes a thickness of the doped silicon layer between the exposed surface and the first face be thin enough so that a channel defined thereby under the gate layer can be fully depleted to form a high resistivity region.

2. The electrical switch in claim 1, wherein the substantially uniform doping profile of the doped silicon layer has peak doping concentration equal to or higher than $4\times10^{19}/\text{cm}^3$.

3. The electrical switch in claim 1, further comprising a substrate arranged on the second face of the isolation layer, the substrate including at least one alignment mark and one semiconductor element covered with insulation or passivation layer.

4. The electrical switch in claim 3, wherein the material of the gate layer, the gate dielectric and the doped silicon layer have an equivalent gate work function providing equivalent opposite doping polarity at the channel from the doping polarity of the doped silicon layer.

5. The electrical switch in claim 3, wherein the electrical contact atop the doped silicon layer is made by using a self-aligned cobalt or nickel silicide process.

6. An electrical switch using a recessed channel gated resistor structure, including:
  an isolation layer having a first face and a second face opposite to the first face;
  a first silicon layer arranged on the first face of the isolation layer and having a predetermined doping level;
  a second silicon layer arranged on the first silicon layer and having higher doping level than that of the first silicon layer and having the same polarity of doping as the first silicon layer, wherein a recess is defined in the second silicon layer to expose part of the area of the first silicon layer;
  a gate dielectric arranged in the recess and covering at least part of the exposed area of the first silicon layer;
  a gate layer arranged atop the gate dielectric and covering at least part of the gate dielectric;
  at least one electrical contact connected to the second silicon layer;
  at least one electrical contact connected to the gate layer;
  wherein the first silicon layer under the exposed area has a thickness be thin enough so that a channel defined thereby under the gate layer can be fully depleted to form a high resistivity region.

7. The electrical switch in claim 6, wherein the electrical contact connected to the second silicon layer is made by using a self-aligned silicide process.

8. The electrical switch in claim 6, wherein the material of the gate layer, the gate dielectric and the first silicon layer have an equivalent gate work function providing equivalent opposite doping polarity at the channel from the doping polarity of the first silicon layer.

9. The electrical switch in claim 8, wherein the equivalent gate work function at room temperature is larger than 4.65 eV for n type first silicon layer or smaller than 4.65 eV for p type first silicon layer.

10. The electrical switch in claim 6, wherein a predetermined doping level of the second silicon layer has peak doping concentration higher than $4\times10^{19}/\text{cm}^3$ or the doping level of the first silicon layer has peak doping concentration equal to or lower than $4\times10^{19}/\text{cm}^3$.

11. The electrical switch in claim 6, further comprising a substrate arranged on the second face of the isolation layer, the substrate including at least one alignment mark and one semiconductor element covered with insulation or passivation layer.

12. The electrical switch in claim 11, wherein the electrical contact connected to the second silicon layer is made by using a self-aligned cobalt or nickel silicide process.

13. The electrical switch in claim 6 wherein the gate dielectric includes a floating gate to form a non-volatile memory cell.

14. An electrical switch using a recessed channel gated resistor structure, including:
  an isolation layer having a first face and a second face opposite to the first face;
  a doped silicon layer arranged on the first face of the isolation layer and having a recessed portion with reduced thickness, the doped silicon layer having a predetermined doping type, wherein the doped silicon layer has a substantially uniform doping profile with same doping concentrations along a direction horizontal to the isolation layer at same depths, respectively, and a doping concentration below an exposed surface of the recessed portion in the doped silicon layer is smaller than a doping concentration above a surface level of the exposed surface in the doped silicon layer;
  a gate dielectric covering at least part of the recessed portion of the doped silicon layer;
  a gate layer arranged atop the gate dielectric and covering at least part of the gate dielectric;
  at least one electrical contact connected to the gate layer;
  a substrate arranged on the second face of the isolation layer, the substrate including at least one semiconductor element covered with insulation layer or passivation layer; wherein the recessed portion in the doped silicon layer makes a thickness of the doped silicon layer between the exposed surface and the first face be thin enough so that a channel defined thereby under the gate can be fully depleted to form a high resistivity region.

15. The electrical switch in claim 14, wherein the substantially uniform doping profile of the doped silicon layer has peak doping concentration equal to or higher than $4\times10^{19}/\text{cm}^3$.

16. The electrical switch in claim 14, wherein an electrical contact connected to the doped silicon layer is made by using a self-aligned silicide process.

17. The electrical switch in claim 14, wherein an equivalent gate work function at room temperature is larger than 4.65 eV for n type said doped silicon layer recessed portion or smaller than 4.65 eV for p type said doped silicon layer recessed portion.

18. The electrical switch in claim 14, wherein said semiconductor element inside said substrate arranged on the second face of the isolation layer has at least one electrical connection through said isolation layer to provide electrical connection to said doped silicon layer arranged on the first face of the isolation layer.

19. The electrical switch in claim 18, wherein said electrical connection has physical current conducting area smaller than 1 um by 1 um.

20. The electrical switch in claim 14, wherein said semiconductor element is a MOSFET.

* * * * *